(12) United States Patent
Lee et al.

(10) Patent No.: US 11,287,679 B2
(45) Date of Patent: Mar. 29, 2022

(54) DISPLAY DEVICE

(71) Applicant: Samsung Display Co., LTD., Yongin-si (KR)

(72) Inventors: Sun Lee, Seongnam-si (KR); Byoung Chel Kim, Yongin-si (KR); Han Yul Yu, Cheonan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 36 days.

(21) Appl. No.: 16/797,652

(22) Filed: Feb. 21, 2020

(65) Prior Publication Data
US 2020/0301193 A1 Sep. 24, 2020

(30) Foreign Application Priority Data
Mar. 22, 2019 (KR) .................. 10-2019-0032830

(51) Int. Cl.
| | |
|---|---|
| *H05K 1/00* | (2006.01) |
| *G02F 1/1333* | (2006.01) |
| *G02F 1/1345* | (2006.01) |
| *H05K 5/00* | (2006.01) |
| *H05K 5/03* | (2006.01) |
| *H05K 1/14* | (2006.01) |
| *H05K 1/11* | (2006.01) |
| *G09G 3/36* | (2006.01) |

(52) U.S. Cl.
CPC .... *G02F 1/133308* (2013.01); *G02F 1/13452* (2013.01); *H05K 1/118* (2013.01); *H05K 1/145* (2013.01); *H05K 5/0017* (2013.01); *H05K 5/03* (2013.01); *G02F 1/13332* (2021.01); *G09G 3/3674* (2013.01); *G09G 3/3685* (2013.01); *H05K 2201/056* (2013.01); *H05K 2201/10136* (2013.01)

(58) Field of Classification Search
CPC ........... G02F 1/133308; G02F 1/13452; G03F 1/13332; H05K 1/118; H05K 1/145
USPC ........................................................ 361/749
See application file for complete search history.

(56) References Cited

U.S. PATENT DOCUMENTS 8,827,536 B2 * 9/2014 Lee ...................... H05K 5/0017
362/633

* cited by examiner

*Primary Examiner* — Andargie M Aychillhum
(74) *Attorney, Agent, or Firm* — Kile Park Reed & Houtteman PLLC

(57) ABSTRACT

A display device includes a display panel, and a top cover disposed around a side surface of the display panel, wherein the top cover includes an accommodation portion corresponding to the side surface of the display panel, a first extension portion extending from an upper end of the accommodation portion, and a second extension portion extending from a lower end of the accommodation portion, such that the first extension portion is offset from the second extension portion.

21 Claims, 23 Drawing Sheets

STP: P1, P2, P3
TC1_1: STP, EX1, EX2_1

DISPLAY DEVICE

This application claims priority from Korean Patent Application No. 10-2019-0032830 under 35 U.S.C. § 119, filed in the Korean Intellectual Property Office on Mar. 22, 2019, the entire contents of which are incorporated herein by reference.

BACKGROUND

1. Field of the Invention

The invention relates to a display device, and more specifically, to a construction therefor that optimizes perception of an image to be formed by joining the display device with other similarly constructed display devices.

2. Description of the Related Art

Display devices, such as a liquid crystal display (LCD) and an organic light emitting display (OLED), have become increasingly important to an expanding variety of applications. An example of these applications includes multimedia.

Around a glass substrate of the display device, an area where a drive integrated circuit (IC) or a printed circuit is provided may be referred to as a bezel in which an image of the display device is not displayed. When multiple display devices are arranged as tiles in a grid arrangement thereof to form a large screen display of an image, the display devices are connected to each other. When such connections are made, the bezels of the multiple display devices become overly pronounced due to a width thereof. As a result, the image to be displayed emphasizes the bezels to an extent that the bezels interfere with a seamless perception of the image.

SUMMARY

Aspects of the invention provide a display device which can decrease perception of a bezel area, and prevent defective attachment between a top cover and a display panel of the display device.

An embodiment of the invention provides a display device including a display panel, and a top cover disposed around a side surface of the display panel, wherein the top cover includes an accommodation portion corresponding to the side surface, a first extension portion extending from an upper end of the accommodation portion, and a second extension portion extending from a lower end of the accommodation portion, such that the first extension portion is offset from the second extension portion.

The accommodation portion may include a first portion as a vertical surface and having a length that is shorter than a length of the side surface of the display panel, a second portion as an inclined surface extending from an upper end of the first portion toward the side surface of the display panel, and a third portion as an inclined surface extending from a lower end of the first portion toward the side surface of the display panel. The first extension portion may include an inclined surface extending from the first portion away from the side surface of the display panel. The second extension portion may include a vertical surface extending from the third portion.

The display device may further include a bottom cover disposed under the display panel and including a bottom portion and a side wall portion. The second extension portion may be fixed to the side wall portion. The side surface of the display panel may be spaced from the first portion of the accommodation portion. The display device may further include an adhesive member disposed between the first portion of the accommodation portion and the side surface of the display panel. The second portion of the accommodation portion may face an upper edge of the display panel, and the third portion of the accommodation portion may face a lower edge of the display panel. The adhesive member may be disposed between the second portion of the accommodation portion and the display panel.

In an embodiment, a display device may include a display panel including a first substrate, a second substrate facing the first substrate, a connection wiring disposed on the first substrate, and a connection pad disposed on the first substrate and the second substrate, and electrically connected to the connection wiring, and a top cover attached to the display panel. The top cover may include an accommodation portion corresponding to a side surface of the first substrate, a side surface of the second substrate, and the connection pad, a first extension portion extending from an upper end of the accommodation portion, and a second extension portion extending from a lower end of the accommodation portion, the first extension portion being offset from the second extension portion.

The accommodation portion may include a first portion as a vertical surface, a second portion as an inclined surface extending from an upper end of the first portion toward a side surface of the second substrate, and a third portion as an inclined surface extending from a lower end of the first portion toward a side surface of the first substrate, and a length of the first portion in the first direction may be shorter than a length of a side surface of the display panel. The first extension portion may be an inclined surface extending from the first portion away from the side surface of the display panel, and the second extension portion may be a vertical surface extending from the third portion. The first portion of the accommodation portion may be spaced from the connection pad.

The display device may further include an adhesive member disposed between the first portion of the accommodation portion and the connection pad. The second portion of the accommodation portion may face an upper edge of the second substrate, and the third portion of the accommodation portion may face a lower edge of the first substrate. The adhesive member may be disposed between the second portion of the accommodation portion and the second substrate, and the adhesive member may be disposed on the side surface of the second substrate and a part of an upper surface of the second substrate.

The display device may further include a flexible circuit board electrically connected to the connection pad, wherein the flexible circuit board may be disposed between the adhesive member and the connection pad, and a contact pad disposed on a surface of the flexible circuit board, wherein the contact pad may be in contact with the connection pad through an adhesive film. The adhesive member may include a resin, and the adhesive film includes an anisotropic conductive film. A surface of the flexible circuit board may be attached to the first portion of the accommodation portion through the adhesive member.

However, aspects of the invention are not restricted to the one set forth herein. The above and other aspects of the invention will become more apparent to one of ordinary skill in the art to which the invention pertains by referencing the detailed description of the invention below.

BRIEF DESCRIPTION OF THE DRAWINGS

An additional appreciation of the above and other aspects and features of the invention will become more apparent by describing in detail exemplary embodiments thereof with reference to the attached drawings, in which.

DETAILED DESCRIPTION OF THE EMBODIMENTS

Figure 1:
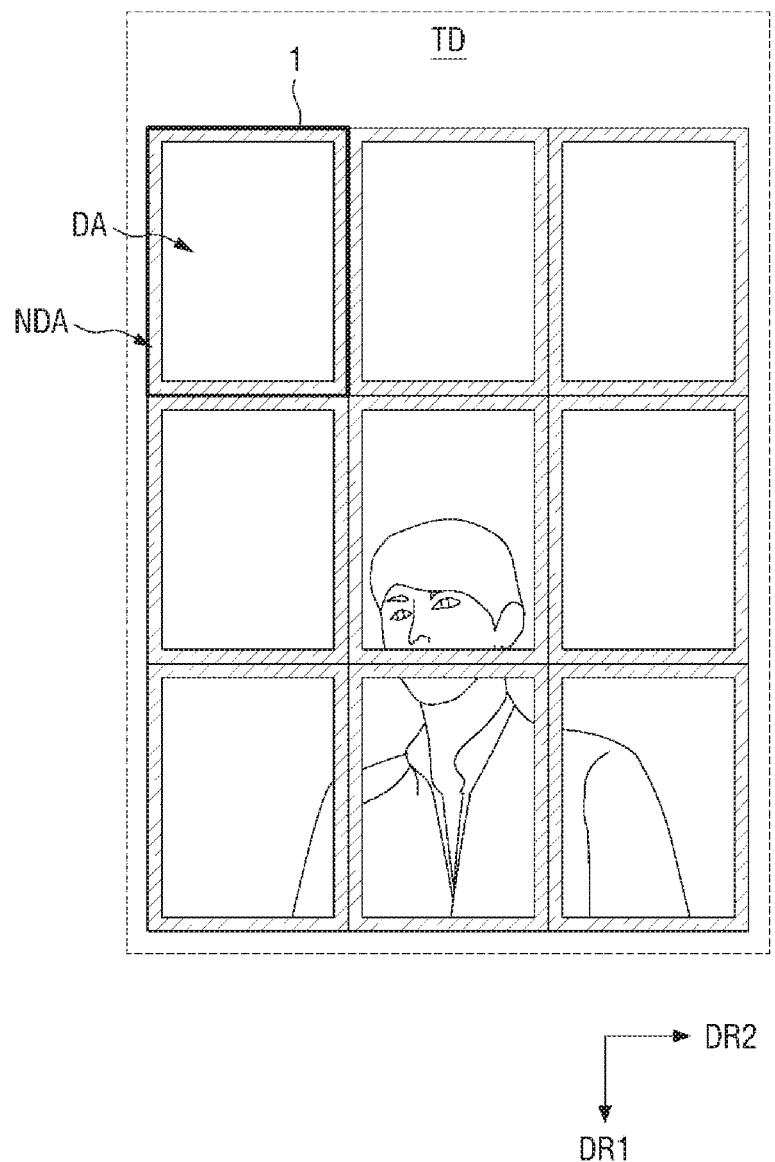
FIG. 1 is a view schematically showing a tiled display apparatus according to an embodiment.

Features of the invention and methods of accomplishing the same may be understood more readily by reference to the following detailed description of embodiments and the accompanying drawings. However, the scope of the invention is not limited to the embodiments in the accompanying drawings and the specification and should be construed as including all the changes, equivalents and substitutions included in the spirit and scope of the invention.

Some of the parts which are not associated with the description may not be provided in order to describe embodiments of the invention and like reference numerals refer to like elements throughout the specification.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (i.e., rotated 90 degrees or at other orientations) and the spatially relative descriptors used herein interpreted accordingly.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Further, in the specification, the phrase "in a plan view" means when an object portion is viewed from above, and the phrase "in a cross-sectional view" means when a cross-section taken by vertically cutting an object portion is viewed from the side. Additionally, the terms "overlap" or "overlapped" means that a first object may be above or below or to a side of a second object, and vice versa.

Figure 2:
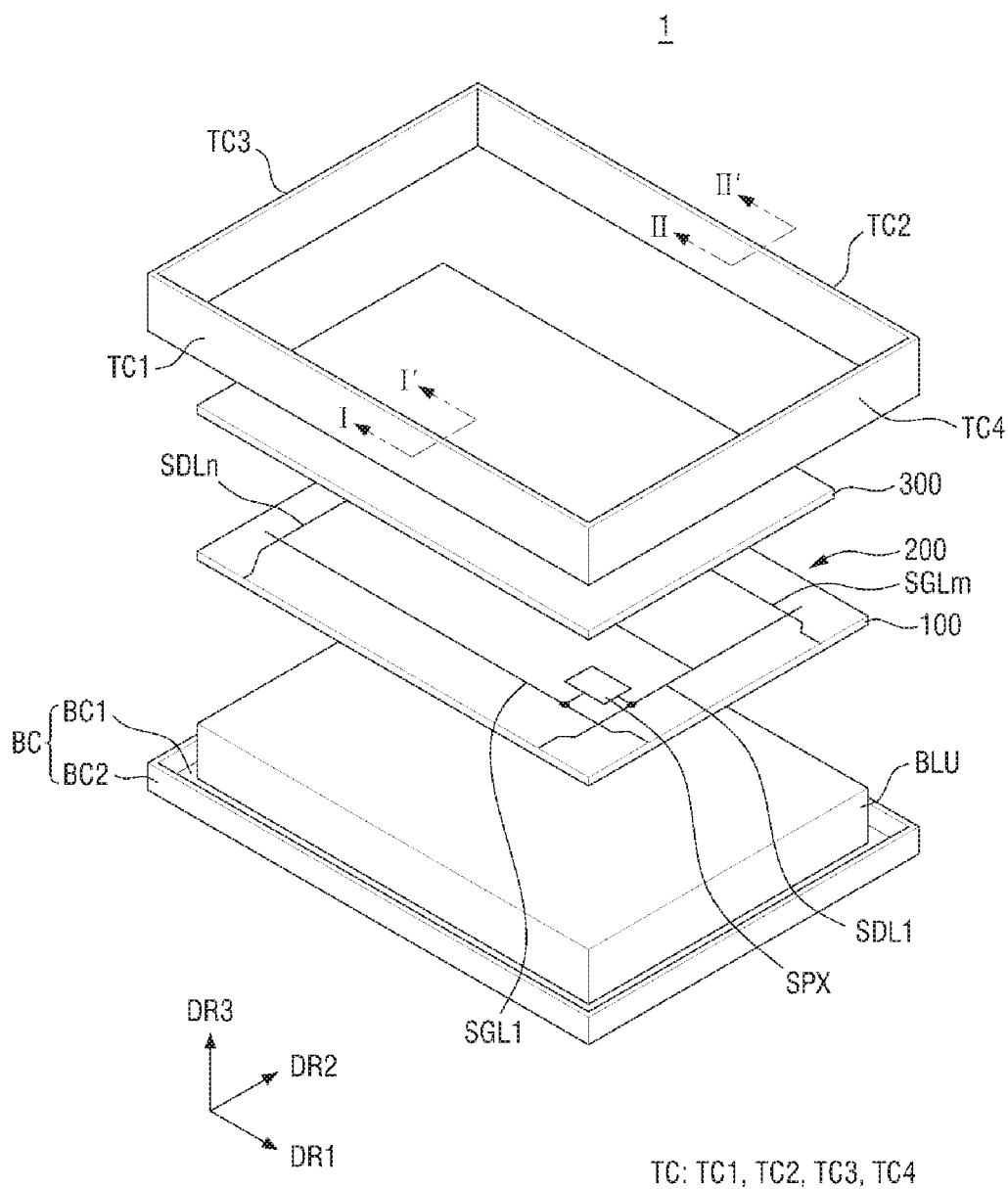
FIG. 2 is an exploded perspective view schematically showing a part of the tiled display apparatus of FIG. 1.
Figure 3:
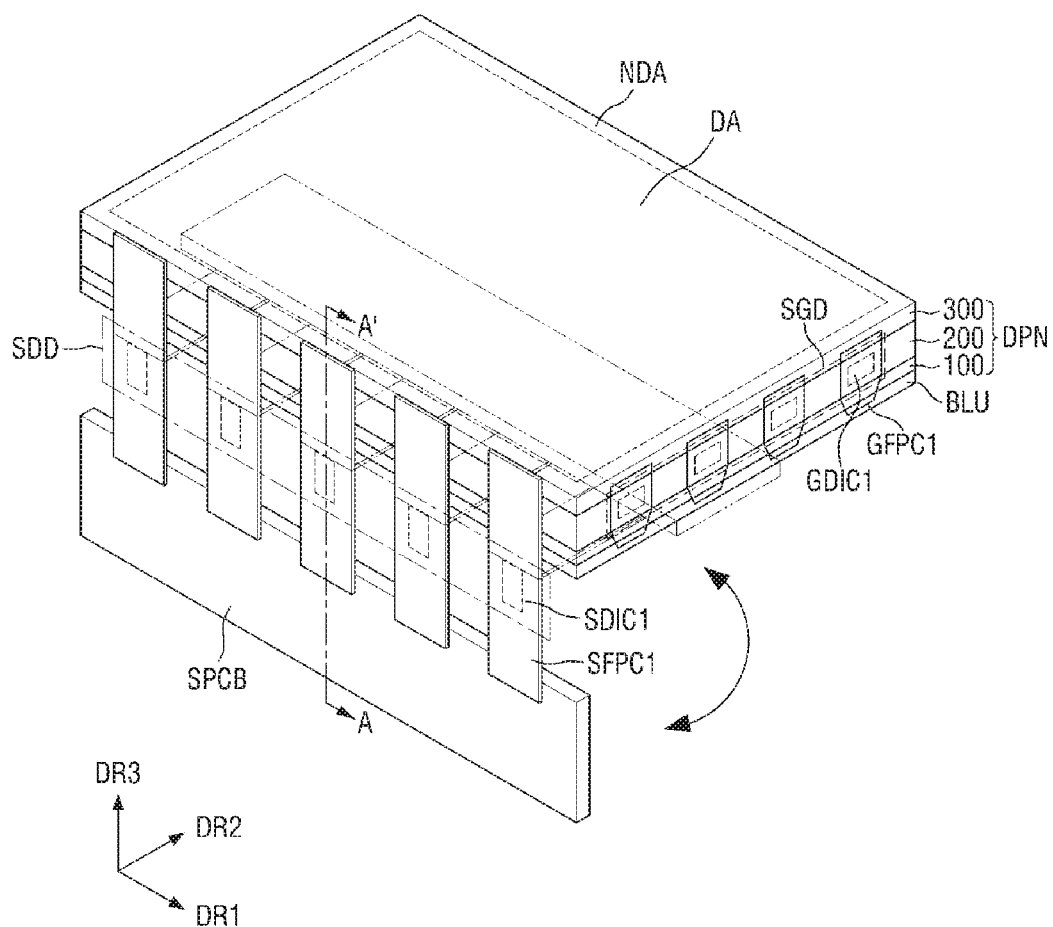
FIG. 3 is a perspective view schematically showing the arrangement of a display panel, a backlight unit, a gate flexible circuit board, a source flexible circuit board, and a printed circuit board according to an embodiment.
Figure 4:
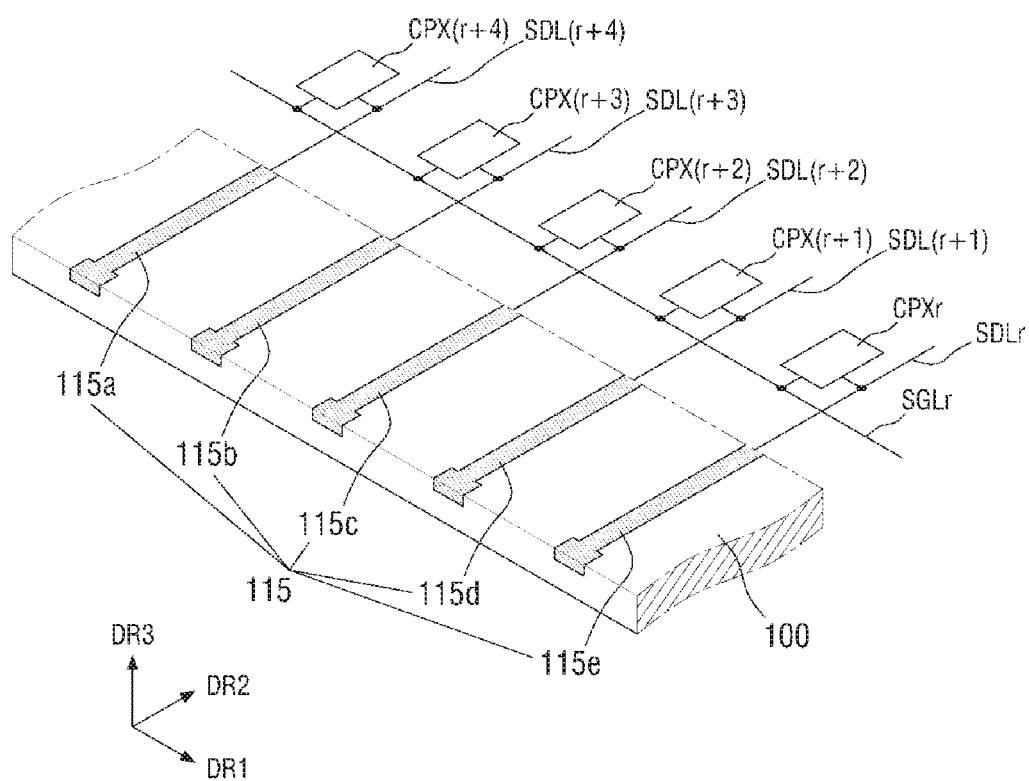
FIG. 4 shows a connection wiring of a display device according to an embodiment.
Figure 5:
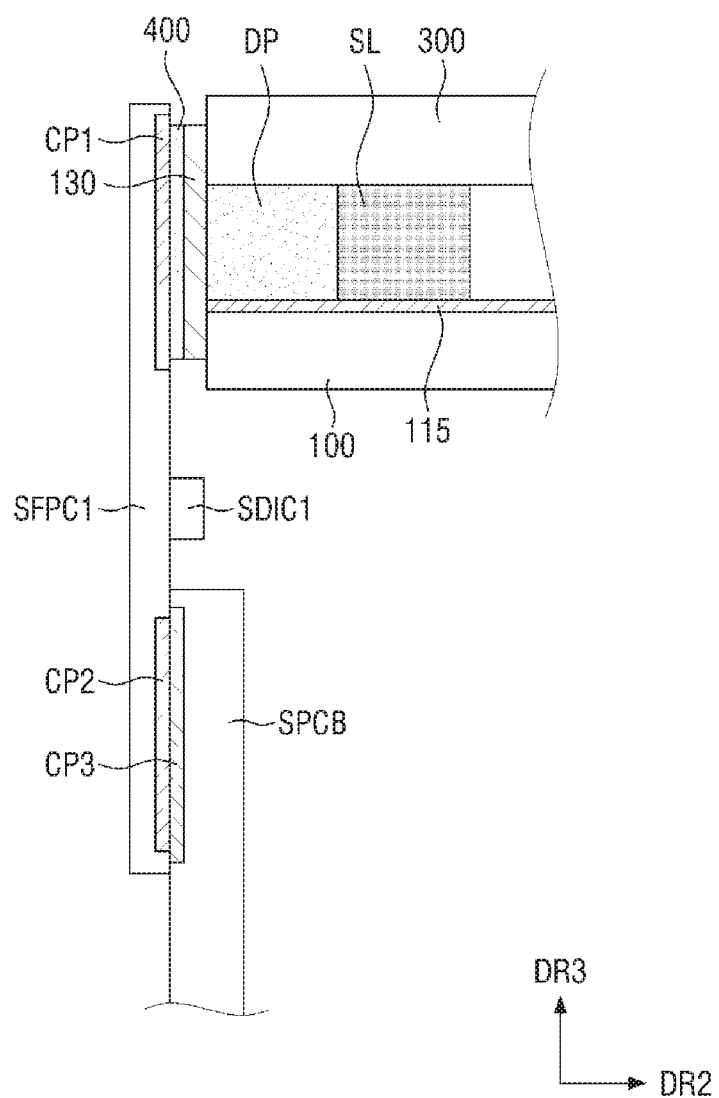
FIG. 5 is a cross-sectional view taken along the line A-A' of FIG. 3 according to an embodiment.
Figure 6:
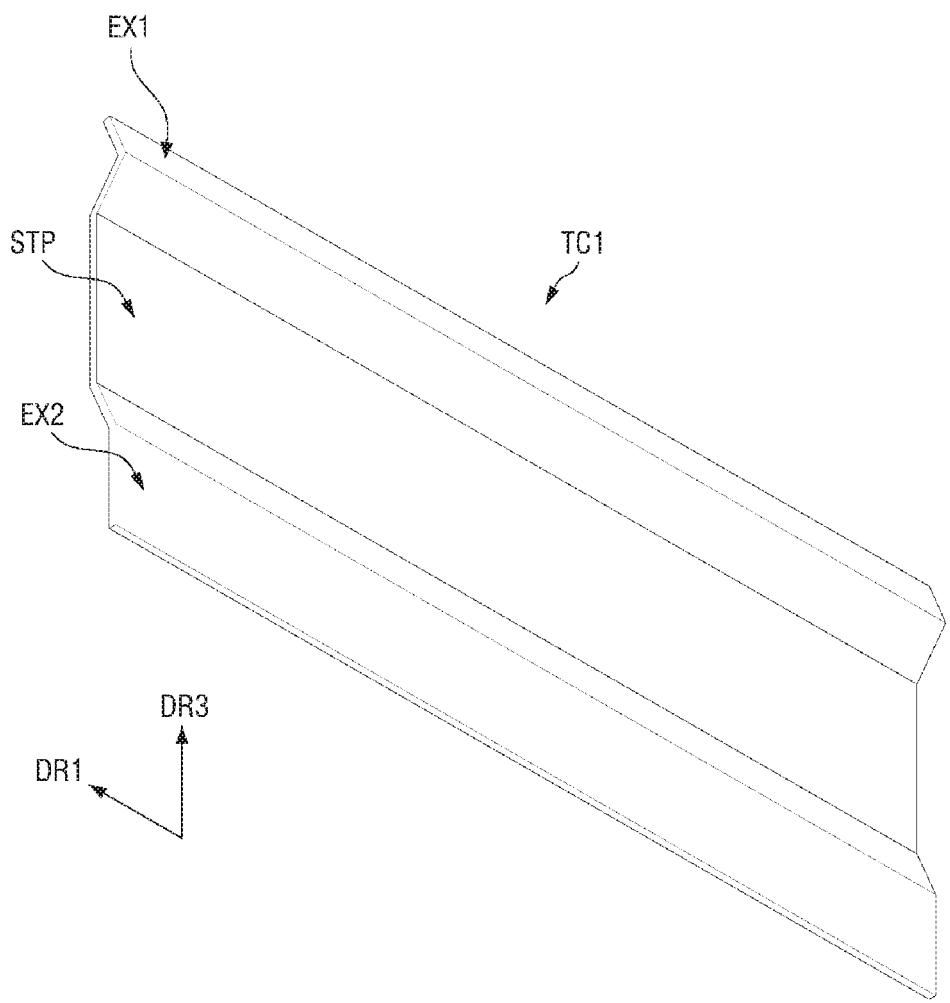
FIG. 6 is a perspective view showing a part of the top cover of FIG. 2.

FIG. 1 is a view schematically showing a tiled display apparatus according to an embodiment, FIG. 2 is an exploded perspective view schematically showing a part of the tiled display apparatus of FIG. 1, FIG. 3 is a perspective view schematically showing the arrangement of a display panel, a backlight unit, a gate flexible circuit board, a source flexible circuit board, and a printed circuit board according to the embodiment, FIG. 4 is a view showing a connection wiring of a display device according to the embodiment, FIG. 5 is a cross-sectional view taken along line A-A' of FIG. 3 according to the embodiment, and FIG. 6 is a perspective view showing a part of the top cover of FIG. 2.

Unless otherwise defined, the terms "upper", "lower", "left", and "right" in the plane direction indicate directions when viewed from above when the display surface is stationary. For example, the term "left" indicates a direction opposite to a second direction DR2, the term "right" indicates the second direction DR2, the term "upper" indicates a direction opposite to a first direction DR1, and the term "lower" indicates the first direction DR1.

The display device 1 may be a self-luminous display device such as an organic light emitting display device, a quantum dot light emitting display device, a micro light emitting diode display device, or a nano light emitting diode display device. Further, the display device 1 may be a non-luminous display device such as an electrophoretic display device or an electrowetting display device. Hereinafter, for convenience of explanation, a case where the display device 1 is a liquid crystal display device including a liquid crystal layer will be described as an example.

In some embodiments, the display device 1 may be applied to large-sized electronic appliances such as televisions and external billboards, and small and middle-sized electronic appliances such as personal computers, notebook computers, car navigators, and cameras. Further, display device 1 may be applied to electronic appliances such as tablet PCs, smart phones, personal digital assistants (PDAs), portable multimedia players (PMPs), game machines, and watches. The above-mentioned electronic appliances are merely examples, and any other electronic appliances may also be employed.

Referring to FIG. 1, a tiled display apparatus TD may include multiple display devices 1. In an exemplary embodiment, the display devices 1 may be arranged in a grid form, but the invention is not limited thereto. For example, the display devices 1 may be connected in a first direction, connected in a second direction, and connected to have a specific shape, for example, a stereoscopic shape. The display devices 1 may have the same size as each other, but the invention is not limited thereto. The display devices 1 may have different sizes from each other.

In an exemplary embodiment, each of the display devices 1 included in the tiled display apparatus TD may have a rectangular shape including long sides and short sides, and may be arranged such that long sides and short sides are connected to each other. Some of the display devices 1 may constitute one side of the tiled display apparatus TD, some of the display devices 1 may be disposed at the corner of the tiled display apparatus TD to constitute adjacent two sides of the tiled display apparatus TD, and some of the display devices 1 may be disposed inside the tiled display apparatus TD so as to be surrounded by other display devices 1.

Each of the display devices 1 may include a display area DA and a non-display area NDA. The display area DA is an area where an image may be displayed, and the non-display area NDA, which may be a bezel area of the display device 1, may be an area where an image is not displayed and be a peripheral area of the display area DA. The non-display area NDA may be disposed to be around a periphery of the display area DA to surround the display area DA, but the invention is not limited thereto. Each of the display devices 1 may have a non-display area NDA having a different shape according to a position of the display device 1, and may also have a non-display area NDA having the same shape.

The tiled display apparatus TD may have a planar shape, but the invention is not limited thereto. The tiled display apparatus TD may have a stereoscopic shape to provide a stereoscopic effect. When the tiled display apparatus TD has a stereoscopic shape, each of the display devices 1 included in the tiled display apparatus TD may have a curved shape, and the display devices 1 may be connected to each other at a predetermined angle to allow the entire tiled display apparatus TD to have a stereoscopic shape.

The display devices 1 may be connected to each other such that their bezel areas, defined as non-display areas NDA, are in contact with each other, and may also be connected to each other through a connection member (not shown). Thus, since the tiled display apparatus TD may be configured such that the display devices 1 are connected to each other and the bezel areas of the display devices 1 are disposed side-by-side at the connection sites, each of the display devices 1 is required to have a thin bezel to minimize perception thereof. Thus, the connection pad of a flexible circuit board may be connected to the side surface of each of the display devices 1 to achieve such minimization.

Referring to FIGS. 2 to 5, each of the display devices 1 may include a display panel DPN, a backlight unit BLU under the display panel DPN, and a bottom cover BC and a top cover TC that each accommodate the display panel DPN and the backlight unit BLU. Although not shown, each of the display devices 1 may further include a fixing member such as a middle frame that is disposed between the top cover TC and the bottom cover BC to fix the display panel DPN in position.

The display panel DPN may include a first substrate 100, a liquid crystal layer 200, and a second substrate 300. In an exemplary embodiment, as shown in FIG. 3, the display panel DPN may further include a source flexible circuit board SFPC1 attached to one side surface of the display panel DPN, a gate flexible circuit board GFPC1 attached to the other side surface of the display panel DPN, and a printed circuit board SPCB connected to the source flexible circuit board SFPC1.

Each of the first substrate 100, the second substrate 300 and the backlight unit BLU may have a rectangular shape having long sides in the first direction DR1 and short sides in the second direction DR2 crossing the first direction DR1. However, the shape of each of the first substrate 100, the second substrate 300 and the backlight unit BLU is not limited thereto. In some embodiments, each of the first substrate 100, the second substrate 300 and the backlight unit BLU may have a curved portion.

The backlight unit BLU may generate light, and may provide the generated light to the first substrate 100, the liquid crystal layer 200, and the second substrate 300. The display panel DPN including the first substrate 100, the liquid crystal layer 200 and the second substrate 300 may generate an image using the light provided from the backlight unit BLU, and may provide the image to the outside of the display device 1.

The display panel DPN may include a display area DA where an image is displayed and a non-display area NDA where an image is not displayed. Although not shown, the display device 1 may further include a window member that covers the display panel DPN and transmits an image to the outside, i.e., over the second substrate 300.

The backlight unit BLU may be, for example, an edge type backlight unit or a direct type backlight unit, but embodiments are not limited thereto.

The first substrate 100 may include pixels SPX. In an exemplary embodiment, the pixels SPX may be arranged in a matrix form, but the invention is not limited thereto. Gate lines SGL1 to SGLm (where m is a natural number) and data lines SDL1 to SDLn (where n is a natural number) may be arranged along the boundary of the pixels SPX. The gate lines SGL1 to SGLm may serve as selection lines for selecting the pixels SPX.

For convenience of explanation, although only one pixel SPX is shown in FIG. 2, a plurality of pixels SPX may be defined on the first substrate 100. Each of the pixels SPX may be provided with a pixel electrode to define the pixel containing such electrode.

The gate lines SGL1 to SGLm and the data lines SDL1 to SDLn may be arranged so as to be insulated from each other and intersect with each other. The gate lines SGL1 to SGLm may extend in the first direction DR1 and may be electrically connected to a gate driver SGD as shown in FIG. 3. The data lines SDL1 to SDLn may extend in the second direction DR2 and may be connected to a data driver SDD.

The pixels SPX may be arranged to be electrically connected to the gate lines SGL1 to SGLm and data lines SDL1 to SDLn that intersect each other. The pixels SPX may be arranged, for example, in a matrix form, but embodiments are not limited thereto.

In some embodiments, the gate driver SGD may include a gate driving chip GDIC1. The gate driver SGD may include one gate driving chip GDIC1, but may also include multiple gate driving chips GDIC1. Although it is illustrated in FIG. 3 that four gate driving chips GDIC1 are arranged, the number of gate driving chips GDIC1 may not be limited thereto. The gate driving chip GDIC1 may be mounted on a gate flexible circuit board GFPC1, and the gate flexible circuit board GFPC1 may be attached to the side surface of the display panel DPN along the second direction DR2 according to a tape carrier package (TCP) construction. Further, in some embodiments, the gate driver SGD may be formed of multiple gate driving chips GDIC1, and may be mounted on the first substrate 100 according to a chip on glass (COG) construction. However, such constructions are merely exemplary. In some embodiments, the gate driver SGD may be disposed in a predetermined area adjacent to at least one of the short sides of the first substrate 100.

The gate driver SGD may be formed simultaneously during a process of manufacturing transistors driving the pixels SPX, and may be mounted on the first substrate 100 in the form of an amorphous silicon TFT gate driving circuit (ASG) or an oxide silicon TFT gate driving circuit (OSG).

The data driver SDD may include a source driving chip SDIC1. The data driver SDD may include one or multiple source driving chip SDIC1. Although it is illustrated in FIG. 3 that five gate driving chips SDIC1 are arranged, the number of source driving chips SDIC1 may not be limited thereto.

The printed circuit board SPCB may include, for example, a timing controller (not shown). The timing controller may be mounted on the printed circuit board SPCB in the form of an integrated circuit chip and may be electrically connected to the gate driver SGD and the data driver SDD. The timing controller may output a gate control signal, a data control signal, and image data.

The gate driver SGD may receive the gate control signal from the timing controller. The gate driver SGD may generate gate signals in response to the gate control signal, and may sequentially output the generated gate signals. The gate signals may be provided to the pixels SPX for each row through the gate lines SGL1 to SGLm. As a result, the pixels SPX may be driven for each row.

The data driver SDD may receive the image data and the data control signal from the timing controller. The data driver SDD may generate analog data voltages corresponding to the image data in response to the data control signal, and may output the analog data voltages. The data voltages may be provided to the pixels SPX through the data lines SDL1 to SDLn.

The pixels SPX may receive the data voltages through the data lines SDL1 to SDLn in response to the gate signals supplied through the gate lines SGL1 to SGLm. The pixels SPX may display gradation corresponding to the data voltages, thereby controlling the transmittance of an area where each pixel SPX is disposed.

Although it is shown in the drawings that the source flexible circuit boards SFPC1 are connected adjacent to the long sides of the first and second substrates 100 and 300, embodiments may not be limited thereto. The positions at which the first and second substrates 100 and 300 and the source flexible circuit boards SFPC1 are connected may be modified as needed. For example, the source flexible printed circuit boards SFPC1 may be disposed adjacent to the short sides of the first and second substrates 100 and 300. Further, the source flexible circuit boards SFPC1 may be disposed on the long sides of the first and second substrates 100 and 300. The source flexible circuit boards SFPC1 may be disposed on the short sides of the first and second substrates 100 and 300, and may also be disposed on the long sides and short sides thereof, respectively. Further, although it is shown in the drawings that the gate flexible circuit boards GFPC1 may be connected adjacent to the short sides of the first and second substrates 100 and 300, embodiments may not be limited thereto. The positions at which the first and second substrates 100 and 300 and the gate flexible circuit boards GFPC1 are connected may be modified as needed. For example, the gate flexible printed circuit boards GFPC1 may be disposed adjacent to the long sides of the first and second substrates 100 and 300. Further, the gate flexible circuit boards GFPC1 may be disposed on the short sides of the first and second substrates 100 and 300. The gate flexible circuit boards GFPC1 may be disposed on the long sides of the first and second substrates 100 and 300, and may also be disposed on the long sides and short sides thereof, respectively.

As shown in FIG. 4, connection wirings 115 may be arranged on the first substrate 100. One end of each of the connection wirings 115a, 115b, 115c, 115d and 115e may be electrically connected to data lines SDLr to SDL(r+4) (where r is a natural number), respectively. Another end of each of the connection wirings 115a, 115b, 115c, 115d, and 115e may be connected to connection pads 130, respectively, as shown in FIG. 5. Accordingly, the connection pads 130 may be electrically connected to the data lines SDLr to SDL(r+4), respectively.

The gate line SGLr may be disposed to intersect the data lines SDLr to SDL(r+4). The pixels CPXr to CPX(r+4) may be electrically connected to the gate line SGLr.

Although five connection wirings 115a, 115b, 115c, 115d, and 115e are shown in the drawings, the number of the connection wirings 115a, 115b, 115c, 115d, and 115e electrically connected to the data lines SDLr to SDL(r+4) may be more than five or less than five.

Although the connection wirings 115 are electrically connected to the data lines SDLr to SDL(r+4) in the above description, embodiments according to the invention are not limited thereto. The connection wirings 115 and the connection pads 130 may be electrically connected to the gate lines SGL1 to SGLm (as shown in FIG. 2) and other wirings of the first substrate 100. Hereinafter, the electrical connection of the data lines SDLr to SDL(r+4) is described below with reference to a particular display device 1.

The connection wirings 115a to 115e may include, for example, copper (Cu), but the material of the connection wirings 115a to 115e may not be limited thereto.

As shown in FIG. 5, the source driving chip SDIC1 that is mounted on the source flexible circuit board SFPC1 may generate data voltages for driving the pixels CPXr to CPX(r+4) that are electrically connected through the connection pad 130. Thus, the generated data voltages may be transmitted to the data lines SDLr to SDL(r+4) through the connection pad 130.

The source flexible circuit board SFPC1 may include a first contact pad CP1. The source driving chip SDIC1 may be electrically connected to the first contact pad CP1 of the source flexible circuit board SFPC1. The first contact pad CP1 of the flexible printed circuit board SFCP1 may be electrically connected to the connection pad 130 disposed on the side surfaces of the first and second substrates 100 and 300 through an adhesive film 400.

The connection pad 130 may be attached to the source flexible circuit board SFPC1 through the adhesive film 400. For example, the connection pad 130 may be electrically connected to the first contact pad CP1 of the source flexible circuit board SFPC1 by an outer lead bonding (OLB) method using the adhesive film 400.

In an exemplary embodiment, the adhesive film 400 may be disposed to cover the entire connection pad 130, but is not limited thereto. In some embodiments, the adhesive film 400 may be disposed so as to cover a part of the connection pad 130 and expose a part thereof.

In some embodiments, the adhesive film 400 may include an anisotropic conductive film (ACF). When the adhesive film 400 is an anisotropic conductive film, the adhesive film 400 has conductivity only in an area where the connection pad 130 is in contact with the first contact pad CP1 of the source flexible circuit board SFPC1, and may electrically connect the connection pad 130 to the first contact pad CP1 of the source flexible circuit board SFPC1. However, the invention is not limited thereto, and in some embodiments, the adhesive film 400 may be omitted. For example, the connection pad 130 and the first contact pad CP1 may be in direct contact with each other to be electrically connected to each other. The connection pad 130 and the first contact pad CP1 may be directly connected to each other by ultrasonic bonding, welding, or the like.

The printed circuit board SPCB may be electrically connected to the source flexible circuit boards SFPC1. Specifically, the second contact pads CP2 of the source flexible circuit boards SFPC1 may be electrically connected to the third contact pads CP3 of the printed circuit board SPCB, and thus the source flexible circuit boards SFPC1 may be electrically connected to the printed circuit board SPCB.

Accordingly, the source driving chips SDIC1 may also be electrically connected to the printed circuit board SPCB.

In some embodiments, the source flexible circuit boards SFPC1 may be provided in the form of a flexible printed circuit board. Specifically, the source flexible circuit boards SFPC1 may be provided in the form of a chip on film (COF). Accordingly, the data driver SDD may be connected to the first and second substrates 100 and 300 and the printed circuit board SPCB by a tape carrier package (TCP) method, and, as shown by the dotted line in FIG. 3, the source flexible circuit boards SFPC1 may be disposed to be bent to the back surface of the backlight unit BLU, so that the printed circuit board SPCB may be located on the back surface of the backlight unit BLU. The source driving chips SDIC1 may be disposed between the backlight unit BLU and the source flexible circuit board SFPC1, but the invention is not limited thereto, and the source driving chips SDIC1 may be disposed on a surface opposite to the surface where the source flexible circuit boards SFPC1 face the backlight unit BLU. In some embodiments, the source driving chips SDIC1 may be disposed on the side surface where the source flexible circuit boards SFPC1 face the backlight unit BLU. For example, the printed circuit board SPCB may be located on the back surface of the backlight unit BLU, the first contact pads CP1 of the source flexible circuit boards SFPC1 may be disposed on the side surface of the display panel, and the source driving chips SDIC1 may face the side surface of the backlight unit BLU.

The connection pad 130, as shown in FIG. 5, may be electrically connected to the connection wiring 115 disposed on the first substrate 100. As described above, the connection pad 130 may be electrically connected to the connection wiring 115, and the connection wiring 115 may extend toward the inside of the first substrate 100 (for example, extend in the second direction DR2) and may be electrically connected to the pixel SPX.

One side of the display panel DPN may be provided with the first substrate 100 and the second substrate 300 may face the first substrate 100.

Each of the first substrate 100 and the second substrate 300 may be a rigid substrate made of glass, quartz or the like, or may be a flexible substrate made of polyimide or other polymer resin. When a polyimide substrate is used as the substrate, there is an advantage that the display panel DPN can be warped, bent, folded or rolled, and thus the display panel DPN can be implemented to be manipulated in various ways.

The connection wiring 115 disposed on the first substrate 100 may be electrically connected to the data lines SDLr to SDL(r+4) that are connected to the gate lines SGL1 to SGLm (as shown in FIG. 4).

Figure 7:
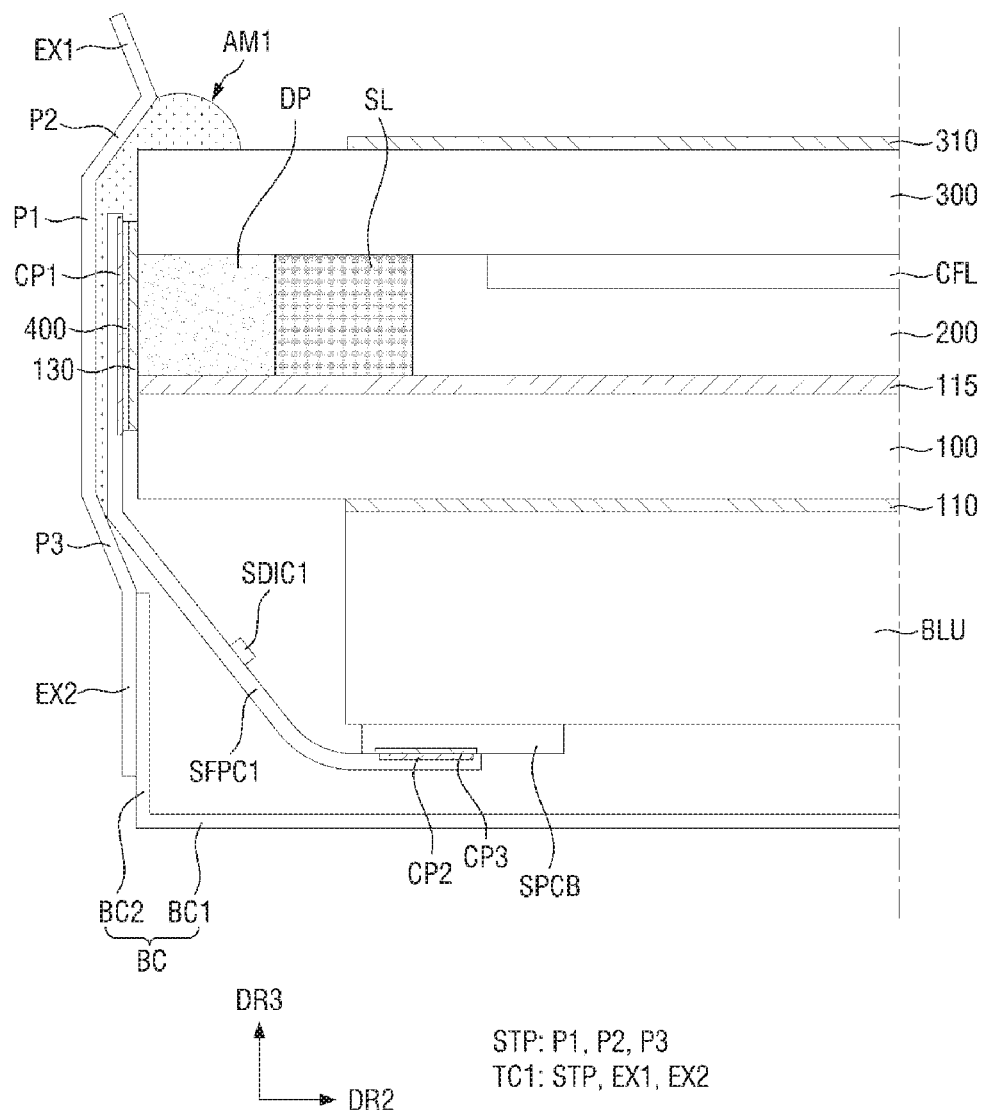
FIG. 7 is a cross-sectional view taken along the line I-I' of FIG. 2 according to an embodiment.

As shown in FIG. 7, a color filter layer CFL and a sealant SL may be disposed between the first substrate 100 and the second substrate 300. The color filter layer CFL may serve to improve the quality of an image output from the display device 1. As shown in FIG. 7, the sealant SL may be disposed along the edges of the two substrates 100 and 300 beyond the color filter layer CFL to prevent the leakage of the liquid crystal layer 200 filled between the first and second substrates 100 and 300.

A dummy pattern DP may be disposed between the first substrate 100 and the second substrate 300 in an area adjacent to the connection pads 130. In an exemplary embodiment, the dummy pattern DP may be fixed to the second substrate 300, and an end of the dummy pattern DP may face the first substrate 100. Further, the end of the dummy pattern DP may be in contact with the structure on the first substrate 100. For example, the end of the dummy pattern DP may be in contact with the connection wiring 115. The dummy pattern DP may have a planar shape and be connected in series between one side of the first substrate 100 and one side of the second substrate 300, but the invention is not limited thereto, and the dummy pattern DP may be disposed to correspond to an area where the connection pad 130 is disposed so as to have an island shape. The dummy pattern DP may also be disposed to be around the edges of the first substrate 100 and the second substrate 300.

In an exemplary embodiment, the second substrate 300 may be provided with a common electrode for applying an electric field to the liquid crystal layer 200 together with the pixel electrode of the first substrate 100, but the invention is not limited thereto, and the first substrate 100 may be provided with both the pixel electrode and the common electrode.

As shown in FIG. 7, the display panel DPN may be provided with a first polarizing member 110 and a second polarizing member 310, each of which selectively transmits specific light. For example, the first polarizing member 110 may be disposed between the backlight unit BLU and the first substrate 100, and the second polarizing member 310 may be disposed on the upper surface of the second substrate 300. However, the invention is not limited thereto.

The bottom cover BC may be a container having a top opening and a storage space of a predetermined depth. For example, the bottom cover BC may include a bottom portion BC1 and a side wall portion BC2.

In some embodiments, the bottom portion BC1 may be flat, and may be provided in a rectangular shape. However, the invention is not limited thereto, and in some embodiments, the bottom portion BC1 may have a predetermined curvature, a circular shape, or a polygonal shape, for example.

In some embodiments, the sidewall portion BC2 may extend in the third direction DR3 at the edge of the bottom portion BC1.

The top cover TC may be disposed to surround a periphery of the side surface of the display panel DPN. In some embodiments, the top cover TC may be disposed to surround a periphery of the side surface of the display panel DPN and a part of the upper surface of the display panel DPN. The top cover TC may be fixedly coupled to the bottom cover BC. For example, in some embodiments, the side surface of the top cover TC and the side wall portion BC2 of the bottom cover BC may be fixed by a screw or the like, and in other embodiments, the side surface of the top cover TC and the side wall portion BC2 of the bottom cover BC may be fixed by an adhesive member or the like.

The top cover TC may include first to fourth top covers TC1, TC2, TC3, and TC4. The first to fourth top covers TC1, TC2, TC3 and TC4 may be respectively attached and fixed, as a top cover TC unitary body, to each of the four side surfaces of the display panel DPN.

When referring to the first top cover TC1 of the top cover TC with reference to FIG. 6, the first top cover TC1 may include an accommodation portion STP corresponding to one side surface of the display panel DPN so as to accommodate the one side surface of the display panel DPN by being disposed around at least a portion of the one side surface, a first extension portion EX1 extending from one end of the accommodation portion STP, and a second extension portion EX2 extending from the other end of the accommodation portion STP.

In some embodiments, the accommodation portion STP may be filled with an adhesive material, and may be disposed at a position by which one side surface of the display panel DPN is attached and fixed with the accommodation portion STP. However, the invention is not limited thereto, and in some embodiments, the accommodation portion STP may be filled with an adhesive material, and may be disposed at a position by which one side surface of the display panel DPN and a part of the upper surface of the display panel DPN extending from the one side surface are attached and fixed with the accommodation portion STP. Further, in some embodiments, the accommodation portion STP may be filled with an adhesive material, and may be disposed at a position by which one side surface of the display panel DPN and a part of the upper surface of the display panel DPN extending from the one side surface and a part of the lower surface of the display panel DPN extending from the one side surface are attached and fixed with the accommodation portion STP.

Further, the source flexible circuit board SFPC1 that is connected to one side surface of the display panel DPN by an outer lead bonding (OLB) method may be accommodated by the accommodation portion STP, wherein the side surfaces of the source flexible circuit board SFPC1 and the display panel DPN may be attached and fixed together with the accommodation portion STP. Further, as described above, the gate flexible circuit board SFPC1 may be attached and fixed with the accommodation portion STP.

In some embodiments, the first extension portion EX1 may extend from an upper end of the accommodation portion STP in the third direction DR3, and an end of the first extension portion EX1 may be disposed higher than the display panel DPN in the third direction DR3. However, the invention is not limited thereto, and in some embodiments, the first extension portion EX1 may extend from the accommodation portion STP in the third direction DR3, and the end of the first extension portion EX1 may be aligned with the display panel DPN in the third direction DR3. Further, in some embodiments, the first extension portion EX1 may extend from the accommodation portion STP in the third direction DR3, and the end of the first extension portion EX1 may be disposed lower than the display panel DPN in the third direction DR3.

In some embodiments, the second extension portion EX2 may extend from a lower end of the accommodation portion STP along the third direction DR3, and may be coupled to the sidewall portion BC2. In some embodiments, the second extension portion EX2 may extend from the accommodation portion STP along the third direction DR3, and may be disposed to be longer than the first extension portion EX1. However, the invention is not limited thereto, and the second extension portion EX2 may extend from the accommodation portion STP along the third direction DR3, and may be disposed to be shorter than the first extension portion EX1. Further, the second extension portion EX2 may extend from the accommodation portion STP along the third direction DR3, and may be disposed to have the same length as the first extension portion EX1.

Each of the accommodation portion STP, the first extension portion EX1 and the second extension portion EX2 included in the first top cover TC1 may extend in the first direction DR1. Although the first top cover TC1 has been described above, the second to fourth top covers TC2, TC3 and TC4 may have the same shape as that of the first top cover TC1. However, the invention is not limited thereto. In some embodiments, unlike the first top cover TC1, the second to fourth top covers TC2, TC3, and TC4 may have a shape extending to be flat in the third direction DR3. In some embodiments, the fourth top cover TC4 may have the same shape as the first top cover TC1, and the second and third top covers TC2 and TC3 may have a shape extending to be flat in the third direction DR3. In some embodiments, the third top cover TC3 may have the same shape as the first top cover TC1, and the second and fourth top covers TC2 and TC4 may have a shape extending to be flat in the third direction DR3. In some embodiments, the fourth top cover TC4 and the second top cover TC2 may have the same shape as the first top cover TC1, and the third top cover TC3 may have a shape extending to be flat in the third direction DR3.

Hereinafter, a description will be made on the basis of the first top cover TC1 located on the side surface of the display panel DPN that is provided with the source flexible circuit substrate SFPC1 by an outer lead bonding (OLB) method, and the second top cover TC2 that faces the first top cover TC1 with the display panel DPN therebetween, assuming that the first to fourth top covers TC1, TC2, TC3, and TC4 have the same shape.

Figure 8:
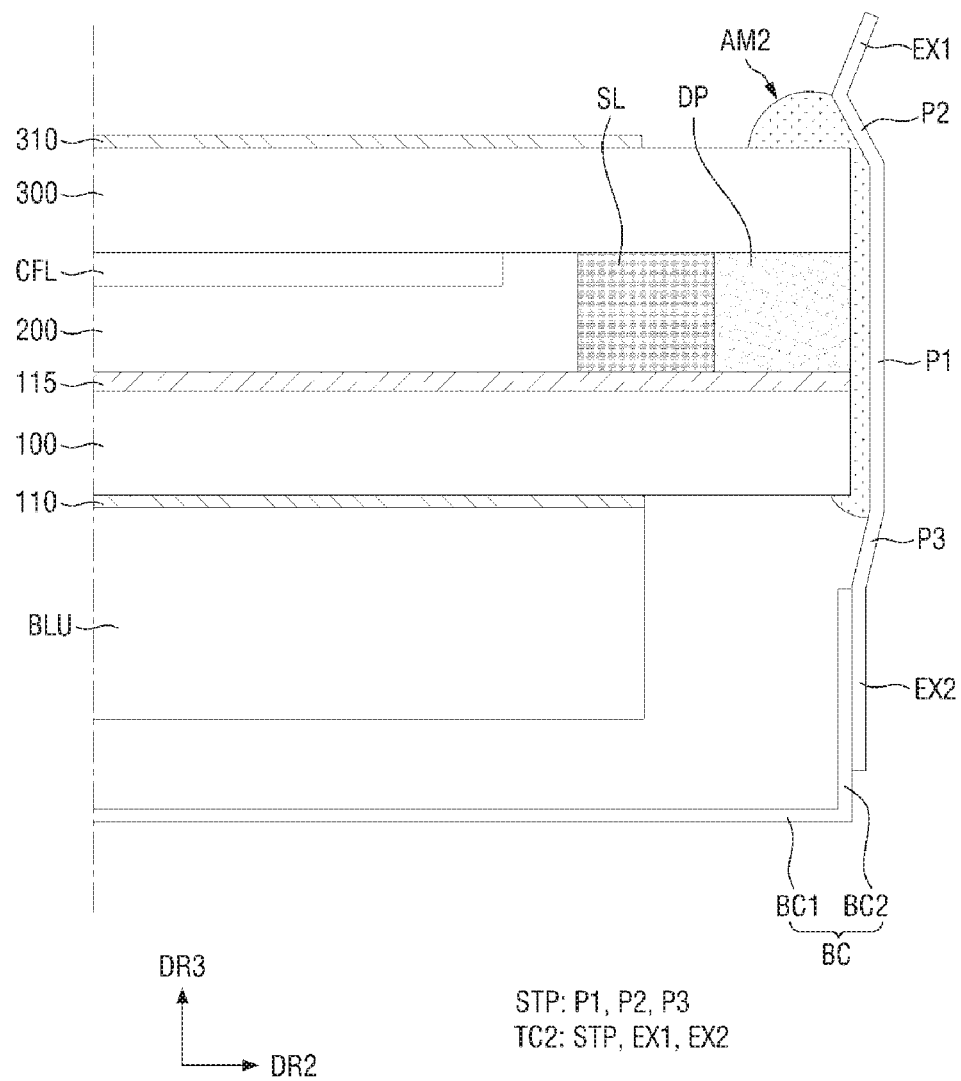
FIG. 8 is a cross-sectional view taken along the line II-II' of FIG. 2 according to an embodiment.
Figure 9:
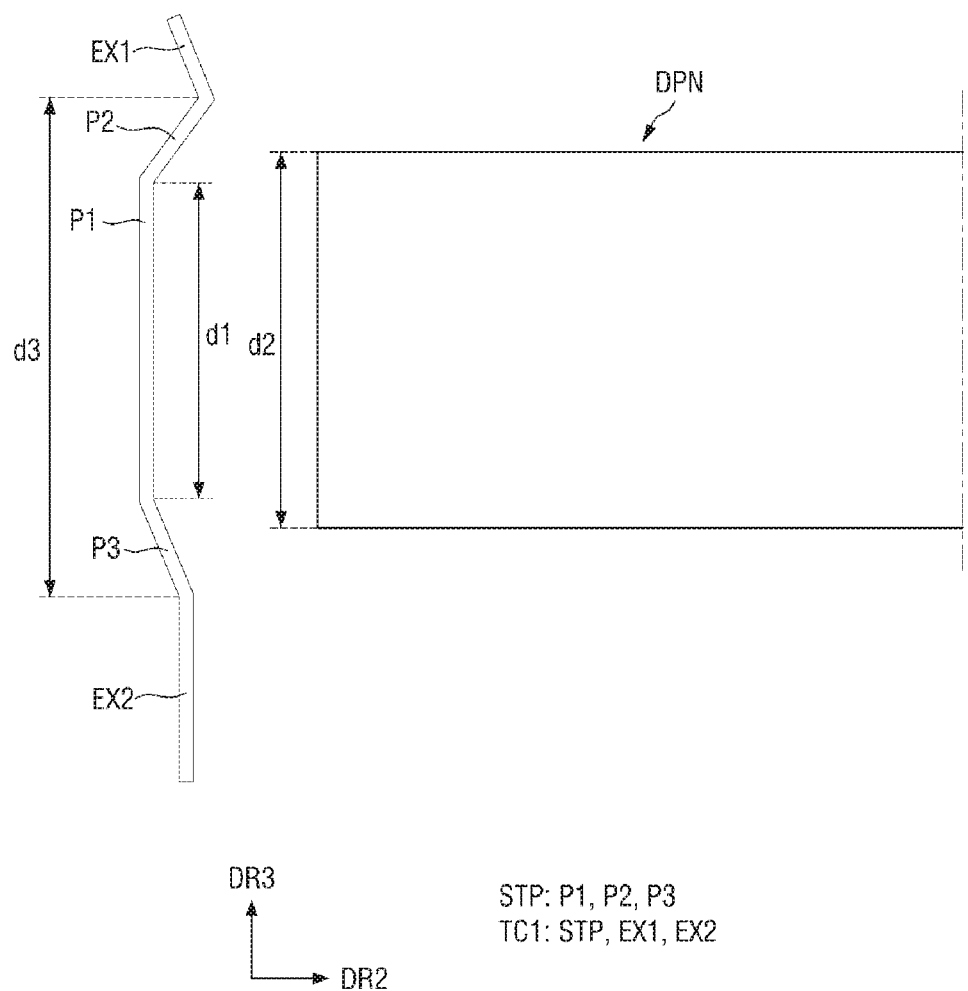
FIG. 9 shows a relationship of a display panel and an accommodation portion.

FIG. 7 is a cross-sectional view taken along line I-I' of FIG. 2 according to an embodiment, FIG. 8 is a cross-sectional view taken along line II-II' of FIG. 2 according to an embodiment, and FIG. 9 is a view showing a relationship of the display panel and the accommodation portion.

Referring to FIG. 7, the second extension portion EX2 of the first top cover TC1 may be coupled with the sidewall portion BC2 of the bottom cover BC to form a storage space, and the backlight unit BLU and the display panel DPN may be located in the storage space. Although not shown, a support member for supporting a part of the display panel DPN or the backlight unit BLU may be located in the bottom cover BC.

One side surface of the display panel DPN may be provided with the connection pad 130 connected to the connection wiring 115. In some embodiments, the connection pad 130 may be in contact with one side surface of the first substrate 100 and one side surface of the second substrate 300. However, the invention is not limited thereto, and in some embodiments, the connection pad 130 may be in contact with only the one side surface of the first substrate 100.

The dummy pattern DP may be disposed between the first substrate 100 and the second substrate 300 may be aligned with one side surface of the first substrate 100 and one side surface the second substrate 300 in the third direction DR3. In this case, the connection pad 130 may be in contact with one side surface of the dummy pattern DP. In some embodiments, the dummy pattern DP may be disposed between the first substrate 100 and the second substrate 300 and may be moved in the second direction DR2 from one side surface of the first substrate 100 and one side surface of the second substrate 300, and therefore, the connection pad 130 may not be in contact with the dummy pattern DP. Further, in some embodiments, even when the dummy pattern DP is disposed between the first substrate 100 and the second substrate 300 and is moved in the second direction DR2 from one side surface of the first substrate 100 and one side surface of the second substrate 300, the connection pad 130 may be disposed inward to the first substrate 100 and the second substrate 300 and may be in contact with the dummy pattern DP.

The display panel DPN may include a source flexible circuit board SFPC1 electrically connected to the connection pad 130 disposed on the side surface of the display panel DPN. Specifically, the first contact pad CP1 of the source flexible circuit board SFPC1 may be electrically connected to the connection pad through the adhesive film 400.

A part of the source flexible circuit board SFPC1 may be disposed or bent to the back surface of the backlight unit BLU, and the second contact pad CP2 of the source flexible circuit board SFPC1 may face the back surface of the backlight unit BLU. Accordingly, the printed circuit board SPCB connected to the second contact pad CP2 of the source flexible circuit board SFPC1 may also be located on the back surface of the backlight unit BLU, and the source driving chips SDIC1 may face the side surface of the backlight unit BLU. In some embodiments, the source driving chips SDIC1 may be located on the back surface of the backlight unit BLU, and the source driving chips SDIC1 and the second contact pad CP2 of the source flexible circuit board SFPC1 may be located on the side surface of the backlight unit BLU.

The first top cover TC1 may include an accommodation portion STP, a first extension portion EX1, and a second extension portion EX2.

The accommodation portion STP may include a first portion P1, a second portion P2 extending from one end of the first portion P1, and a third portion P3 extending from the other end of the first portion P1.

The first portion P1 may be a vertical surface extending in the third direction DR3. The first portion P1 may face one side surface of the display panel DPN in which the source flexible circuit board SFPC1 is disposed by an outer lead bonding (OLB) method. The portion P1 may overlap a part of one side surface of the first substrate 100 and a part of one side surface of the second substrate 300, the dummy pattern DP, the connection pad 130, and the first contact pad CP1 of the source flexible circuit substrate SFPC1 in the second direction DR2.

The second portion P2 may be an inclined surface extending from the first portion P1 in the third direction DR3 and may be inclined at a predetermined angle from the upper end of the first portion P1 toward the display panel DPN. The second portion P2 may be an inclined surface having an acute angle of inclination and may extend from the first portion P1 in the third direction DR3 with respect to the second direction DR2. The second portion P2 may face the one side edge of the second substrate 300. However, the invention is not limited thereto, and in some embodiments, the second portion P2 may face the upper surface of the second substrate 300.

The third portion P3 may be an inclined surface extending from the first portion P1 along the third direction DR3 and inclined at a predetermined angle from the lower end of the first portion P1 toward the display panel DPN. The third portion P3 may be an inclined surface having an acute angle of inclination and may extend from the first portion P1 along the third direction DR3 with respect to the second direction DR2. The third portion P3 may face the one side edge of the second substrate 300 and a portion where the source flexible circuit substrate SFPC1 is bent, as shown in FIG. 7.

The first extension portion EX1 may be an inclined surface extending from the second portion P2 in the third direction DR3 and inclined at a predetermined angle from the upper end of the second portion P2 toward the opposite side of the display panel DPN, i.e., away from the display panel DP. The first extension portion EX1 may be an inclined surface having an obtuse angle of inclination and may extend from the second portion P2 in the third direction DR3 with respect to the second direction DR2. As such, the perception of the bezel of the display device 1 adjacent to the display area DA may be reduced since, at least, the first extension portion EX1 is angled away from the display area DA.

The second extension portion EX2 may be a vertical surface extending from the third portion P3 along the third direction D3. The second extension portion EX2 may fixed to the side wall portion BC2 of the bottom cover BC, and the length of the second extension portion EX2 may be longer than the length of the first extension portion EX1 for the stable fixation of the second extension portion EX2 with the side wall portion BC2.

A first adhesive member AM1 may be located between the first top cover TC1 and the display panel DPN. The first adhesive member AM1 may be located between the accommodation portion STP and the display panel DPN. The first adhesive member AM1 may be distributed between the first portion P1 and the source flexible circuit board SFPC1, and between the second portion P2 and the second substrate 300. The first adhesive member AM1 may include a resin. For example, the first adhesive member AM1 may include an oligomer, urethane acrylate, a monomer, a photoinitiator, a solvent, and a ketone.

The thickness of the first adhesive member AM1 disposed between the first portion P1 and the source flexible circuit board SFPC1 in the second direction DR2 may be different from the thickness of the first adhesive member AM1 disposed between the second portion P2 and the second substrate 300 in the second direction DR2. For example, the thickness of the first adhesive member AM1 disposed between the second portion P2 and the second substrate 300 in the second direction DR2 may be greater than the thickness of the first adhesive member AM1 disposed between the first portion P1 and the source flexible circuit board SFPC1 in the second direction DR2. However, the invention is not limited thereto, and the thickness of first adhesive member AM1 may be variously changed according to the shape of one side surface of the first adhesive member AM1, the shape of the source flexible circuit substrate SFPC1, the shape of the first top cover TC1, and the arrangement therebetween.

In some embodiments, the first adhesive member AM1 disposed between the second portion P2 and the second substrate 300 may be disposed on a part of the side surface of the second substrate 300, the edge of the second substrate 300, and a part of the upper surface of the second substrate 300. Thus, the contact area between the first top cover TC1 and the display panel DPN may be further increased. As such, since the first top cover TC1 includes the accommodation portion STP, the first adhesive member AM1 may be distributed between the first portion P1 and the source flexible circuit board SFPC1 and between the second portion P2 and a part of the side surface of the second substrate 300, the edge of the second substrate 300, and a part of the upper surface of the second substrate 300. Accordingly, the one side surface of the display panel DPN on which the source flexible circuit board SFPC1 is disposed may be more firmly attached and fixed by an outer lead bonding (OLB) method.

Referring to FIG. 8, the second top cover TC2 may include an accommodation portion STP, a first extension portion EX1, and a second extension portion EX2.

The accommodation portion STP may include a first portion P1, a second portion extending from one end of the first portion P1, and a third portion P3 extending from the other end of the first portion P1.

The first portion P1 may face the other side of the display panel DPN. The first portion P1 may overlap the first substrate 100, a part of the other side surface of the second substrate 300, and the dummy pattern DP in the second direction DR2.

The second portion P2 may be an inclined surface extending from the first portion P1 in the third direction DR3 and inclined at a predetermined angle from the upper end of the first portion P1 toward the display panel DPN. The second portion P2 may be an inclined surface having an obtuse angle of inclination and extending from the first portion P1 in the third direction DR3 with respect to the second direction DR2. The second portion P2 may face the other side edge of the second substrate 300. In some embodiments, the second portion P2 may face the upper surface of the second substrate 300.

The third portion P3 may be an inclined surface extending from the first portion P1 along the third direction DR3 and inclined at a predetermined angle from the lower end of the first portion P1 toward the display panel DPN. Illustratively, the third portion P3 may be an inclined surface having an obtuse angle of inclination and may extend from the first portion P1 along the third direction DR3 with respect to the second direction DR2. The third portion P3 may face the other side edge of the second substrate 300.

The first extension portion EX1 may be an inclined surface extending from the second portion P2 in the third direction DR3 and inclined at a predetermined angle from the upper end of the second portion P2 toward the opposite side of the display panel DPN. The first extension portion EX1 may be an inclined surface having an acute angle of inclination and may extend from the second portion P2 in the third direction DR3 with respect to the second direction DR2. As such, the perception of the bezel adjacent the display area DA of the display device 1 may be reduced since, at least, the first extension portion EX1 is angled away from the display area DA.

The second extension portion EX2 may be a vertical surface extending from the third portion P3 along the third direction D3. The second extension portion EX2 may fixed to the side wall portion BC2 of the bottom cover BC, and the length of the second extension portion EX2 may be longer than the length of the first extension portion EX1 for the stable fixation of the second extension portion EX1 with the side wall portion BC2.

A second adhesive member AM2 may be disposed between the second top cover TC2 and the display panel DPN. Illustratively, the second adhesive member AM2 may be disposed between the accommodation portion STP and the display panel DPN. The second adhesive member AM2 may be distributed between the first substrate 100 and the first portion P1, between the second substrate 300 and the first portion P1, and between the dummy pattern DP and the first portion P1. Further, the second adhesive member AM2 may be distributed between the second portion P2 and the second substrate 300 and between the third portion P3 and the first substrate 100.

The thickness of the second adhesive member AM1 disposed between the first substrate 100 and the first portion P1, between the second substrate 300 and the first portion P1, and between the dummy pattern DP and the first portion P1 in the second direction DR2, the thickness of the second adhesive member AM2 disposed between the second portion P2 and the second substrate 300 in the second direction DR2 in the second direction DR2, and the thickness of the second adhesive member AM2 disposed between the third portion P3 and the first substrate 100 in the second direction DR2 may be different from one another. The thickness of the second adhesive member AM2 disposed between the second portion P2 and the second substrate 300 in the second direction DR2 may be smaller than the thickness of the second adhesive member AM2 disposed between the first substrate 100 and the first portion P1, between the second substrate 300 and the first portion P1 and between the dummy pattern DP and the first portion P1 in the second direction DR2. Further, the thickness of the second adhesive member AM2 disposed between the second portion P2 and the second substrate 300 may be smaller than the thickness of the second adhesive member AM2 disposed between the third portion P3 and the first substrate 100 in the second direction DR2. Further, the thickness of the second adhesive member AM2 disposed between the first substrate 100 and the first portion P1, between the second substrate 300 and the first portion P1 and between the dummy pattern DP and the first portion P1 in the second direction DR2 may be larger than the thickness of the second adhesive member AM2 disposed between the third portion P3 and the first substrate 100 in the second direction DR2. However, the invention is not limited thereto, and the thickness of the second adhesive member AM2 may be variously changed according to the shape of the other side surface of the display panel DPN, the shape of the second top cover TC2, and the arrangement therebetween.

In some embodiments, the second adhesive member AM2 disposed between the second portion P2 and the second substrate 300 may be disposed on a part of the side surface of the second substrate 300, the edge of the second substrate 300, and a part of the upper surface of the second substrate 300, and the second adhesive member AM2 disposed between the third portion P3 and the first substrate 100 may be disposed on a part of the side surface of the first substrate 100, the edge of the first substrate 100, and a part of the lower surface of the first substrate 100. As such, since the second top cover TC2 includes the accommodation portion STP, the second adhesive member AM2 may be distributed between the first portion P1 and the first substrate 100, between the second substrate 300 and the dummy pattern DP, between the second portion P2 and the second substrate 300 and between the third portion P3 and the first substrate 100. Accordingly, the other side surface of the display panel DPN opposite the side surface corresponding to the first top cover TC1 may be firmly attached and fixed.

Further, the distribution of the first adhesive member AM1 disposed between one side surface of the display panel DPN and the first top cover TC1 may be different from the distribution of the second adhesive member AM2 disposed between the other side surface of the display panel DPN and the second top cover TC2.

Referring to FIG. 9, one side surface of the display panel DPN may be disposed over or alongside the first portion P1, second portion P2 and third portion P3 of the accommodation portion STP. The first length d1 of the first portion P1 in the third direction DR3 may be shorter than the second length d2 of one side surface of the display panel DPN in the third direction DR3, and the third length d2 of the accommodation portion STP in the third direction DR3 may be longer than the second length d2 of one side surface of the display panel DPN in the third direction DR3.

One side surface of the display panel DPN may thus be accommodated by the accommodation portion STP, in which the first portion P1 of the accommodation portion STP may entirely overlap one side surface portion of the display panel DPN, and the second portion P2 and third portion P3 thereof may partially overlap one side surface portion of the display panel DPN. In some embodiments, one side surface of the display panel DPN may be accommodated in the accommodation portion STP, in which the first portion P1 and third portion P3 of the accommodation portion STP may overlap one side surface portion of the display panel DPN, but the second portion P2 thereof may not overlap one side surface portion of the display panel DPN. Further, in some embodiments, one side surface of the display panel DPN may be accommodated by the accommodation portion STP, in which the first portion P1 and second portion P2 of the accommodation portion STP may overlaps one side surface portion of the display panel DPN, but the third portion P3 thereof may not overlap one side surface portion of the display panel DPN. As such, since one side surface of the display panel DPN may be accommodated by the accommodation portion STP, the display panel DPN and the first top cover TC1 may be properly aligned with each other. Further, a space may be formed between the first portion P1 and one side surface portion of the display panel DPN, and the first adhesive member AM1 may be disposed in the space to firmly attach and fix the same together. Although the first top cover TC1 has been described with reference to FIG. 9, the second to fourth top covers TC2, TC3, and TC4 may be arranged similarly according to the above descriptions.

In each of the above descriptions, one or more of the extension portions EX1 and EX2 may extend in the third direction DR3 so as to be offset from each other and the accommodation portion STP in the second direction DR2 and/or the third direction D3. In this respect, one or more of the portions P1, P2, and P3 of the accommodation portion STP may also extend in the third direction DR3 so as to be offset from each other and one or more of the extension portions EX1 and EX2 in the second direction DR2 and/or the third direction D3. In these respects, the offset of one or more of the extension portions EX1 and EX2 and portions P1, P2, and P3 may be provided as one or more of the aforementioned may be slantingly disposed from an adjacent one of connected portions. In these ways, the accommodation portion STP may be disposed around operative connections for the pixels and the side surface of the display panel DP. As such, the operative connections for the pixels SPX and the side surface of the display panel DP may be properly aligned with the top covers TC1 and TC2 and the perception of the bezel may be reduced to enhance visualization of an image to be displayed by display devices 1 of a tiled display TD thereof.

FIGS. 10 to 13 are views showing attachment of a display panel to a top cover according to an embodiment.

Figure 10:
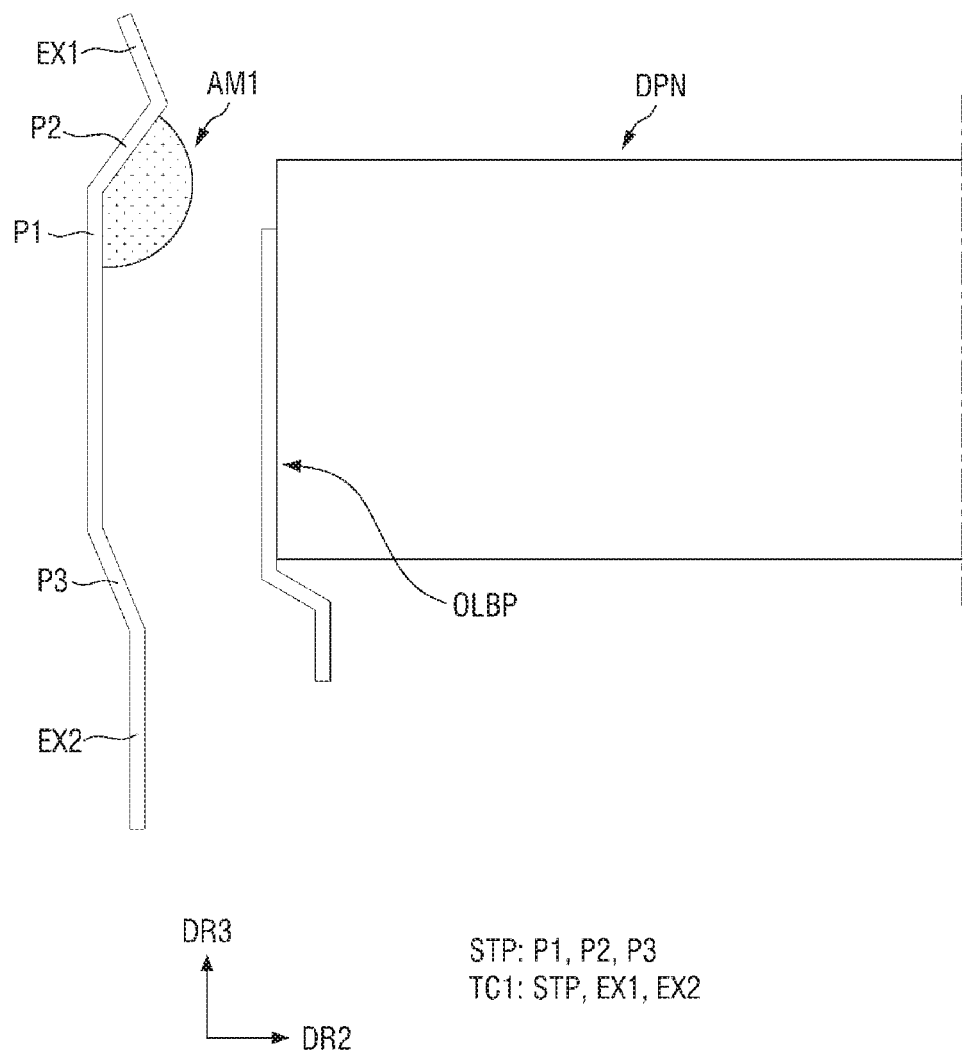
FIGS. 10 to 13 show the attachment of the display panel to a top cover according to an embodiment.

Referring to FIG. 10, a first adhesive member AM1 may be disposed between the first top cover TC1 and one side surface of the display panel DPN. One side surface of the display panel DPN may be formed with an outer lead bonding portion OLBP, and the first adhesive member AM1 may be disposed on one side surface of the accommodation portion STP facing the outer lead bonding portion OLBP.

In some embodiments, the first adhesive member AM1 may be located between the first portion P1 and second portion P2 of the accommodation portion STP. In some embodiments, the first adhesive member AM1 may be located only on the first portion P1. In some embodiments, the first adhesive member AM1 may be located only on the second portion P2. In some embodiments, the first adhesive member AM1 may be disposed with the accommodation portion STP, and first adhesive members AM1 may be arranged to be spaced apart from each other with respect to the accommodation portion STP.

Figure 11:
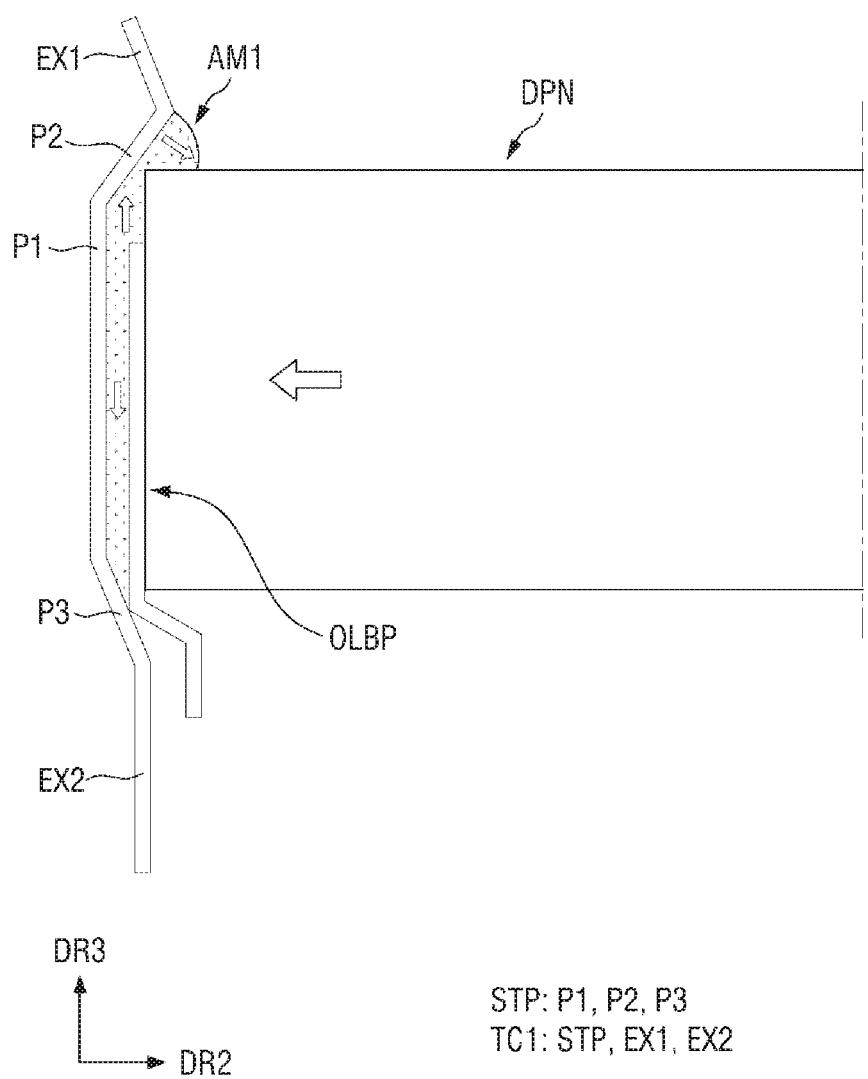

Referring to FIG. 11, when the display panel DPN is pressed in a direction opposite to the second direction DR2 (or when the first top cover TC1 is pressed in the second direction DR2), the first adhesive member AM1 located between the first portion P1 and second portion P2 of the accommodation portion STP may be uniformly distributed between the first portion P1 and the outer lead bonding portion OLBP, between the second portion P2 and a part of the side surface of the second substrate 300, between the second portion P2 and the edge of the second substrate 300 and between the second portion P2 and a part of the upper surface of the second substrate 300.

A space is formed between the first portion P1 and the outer lead bonding portion OLBP due to the difference in length between the first portion P1 and one side surface of the display panel DPN, and the first adhesive member AM1 may be moved into the space. The second portion P2 is formed of an inclined surface extending from the first portion P1 in the third direction DR3 and inclined at a predetermined angle from the first portion P1, and thus the first adhesive member AM1 may be moved between a part of the side surface of the second substrate 300, the edge of the second substrate 300 and a part of the upper surface of the second substrate 300. Accordingly, the outer lead bonding portion OLBP, which is formed with one side surface of the display panel DPN, and the first top cover TC1 may be firmly attached and fixed.

Figure 12:
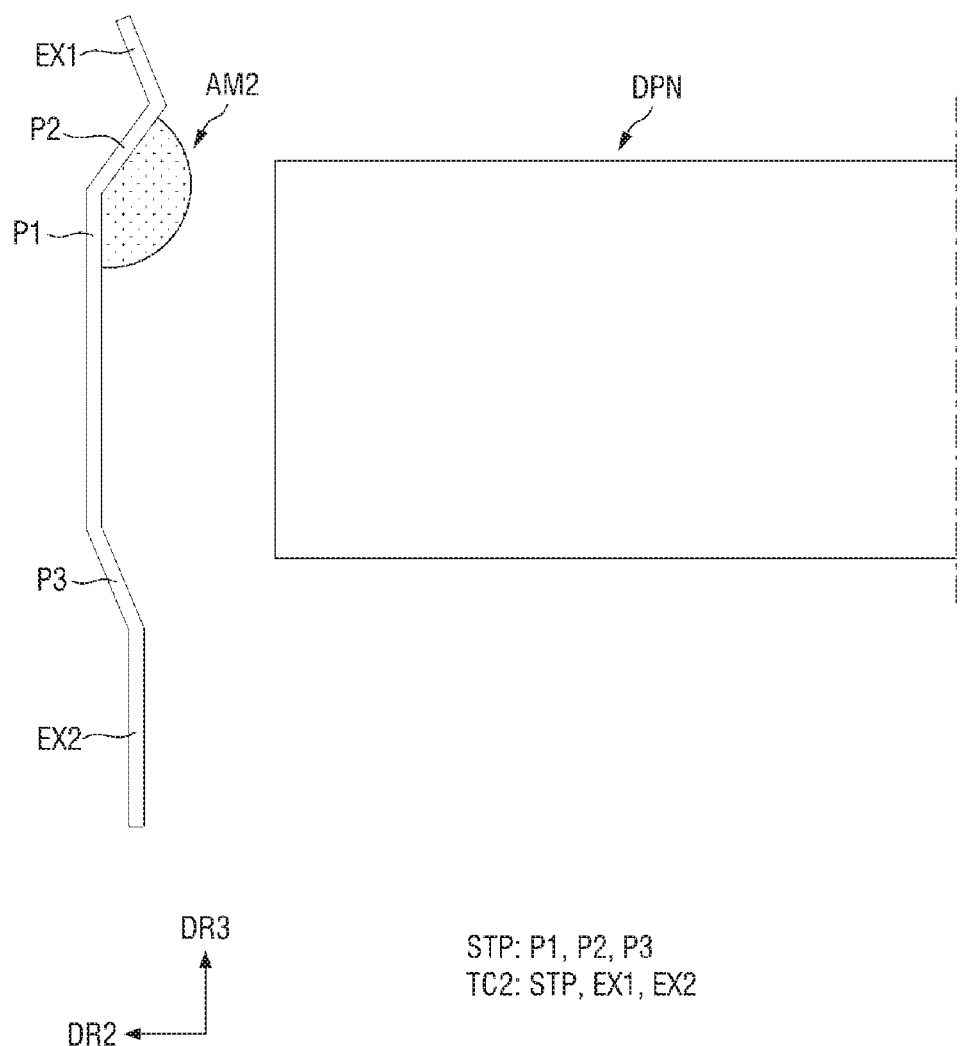

Referring to FIG. 12, a second adhesive member AM2 may be disposed between the second top cover TC2 and the other side surface of the display panel DPN that is opposite the first top cover TC1. The second adhesive member AM2 may be disposed on one side surface of the accommodation portion STP facing the other side surface of the display panel DPN.

Figure 13:
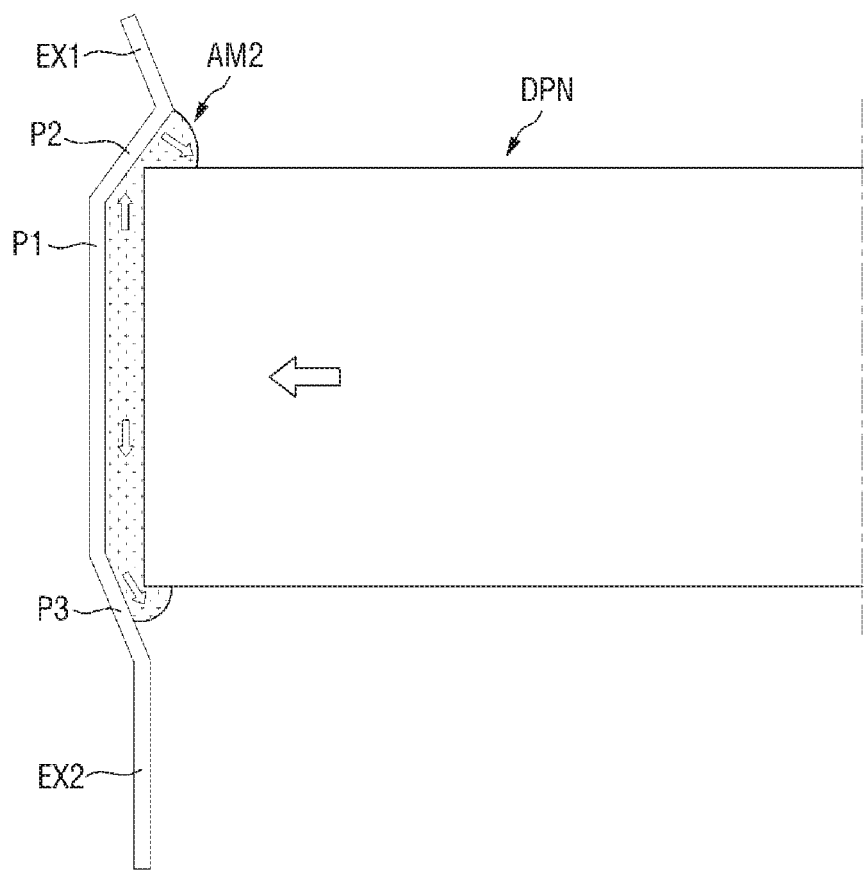

Referring to FIG. 13, when the display panel DPN is pressed in the second direction DR2 (or when the second top cover TC2 is pressed in a direction opposite to the second direction DR2), the second adhesive member AM2 located between the first portion P1 and second portion P2 of the accommodation portion STP may be uniformly distributed between the first portion P1 and the other side surface of the display panel DPN, between the second portion P2 and a part of the side surface of the second substrate 300, between the second portion P2 and the edge of the second substrate 300, between the second portion P2 and a part of the upper surface of the second substrate 300, between the third portion P3 and a part of the side surface of the first substrate 100, between the third portion P3 and the edge of the first substrate 100, and between the third portion P3 and a part of the upper surface of the first substrate 100.

A space is formed between the first portion P1 and the other side surface of the display panel DPN due to the difference in length between the first portion P1 and the other side surface of the display panel DPN. The second adhesive member AM2 may be moved into the space. The second portion P2 is formed of an inclined surface extending from the first portion P1 in the third direction DR3 and inclined at a predetermined angle from the first portion P1, and thus the second adhesive member AM2 may be moved between a part of the side surface of the second substrate 300, the edge of the second substrate 300 and a part of the upper surface of the second substrate 300. The third portion P3 is formed of an inclined surface extending from the first portion P1 in the third direction DR3 and inclined at a predetermined angle from the first portion P1, and thus the second adhesive member AM2 may be moved between a part of the side surface of the first substrate 100, the edge of the first substrate 100 and a part of the upper surface of the first substrate 100. Accordingly, the other side surface of the display panel DPN and the second top cover TC2 may be firmly attached and fixed. Although not shown, the third and fourth top covers TC3 and TC4 may be attached and fixed to the side surface of the display panel DPN in the same manner as any one of the first top cover TC1 and the second top cover TC2.

Figure 14:
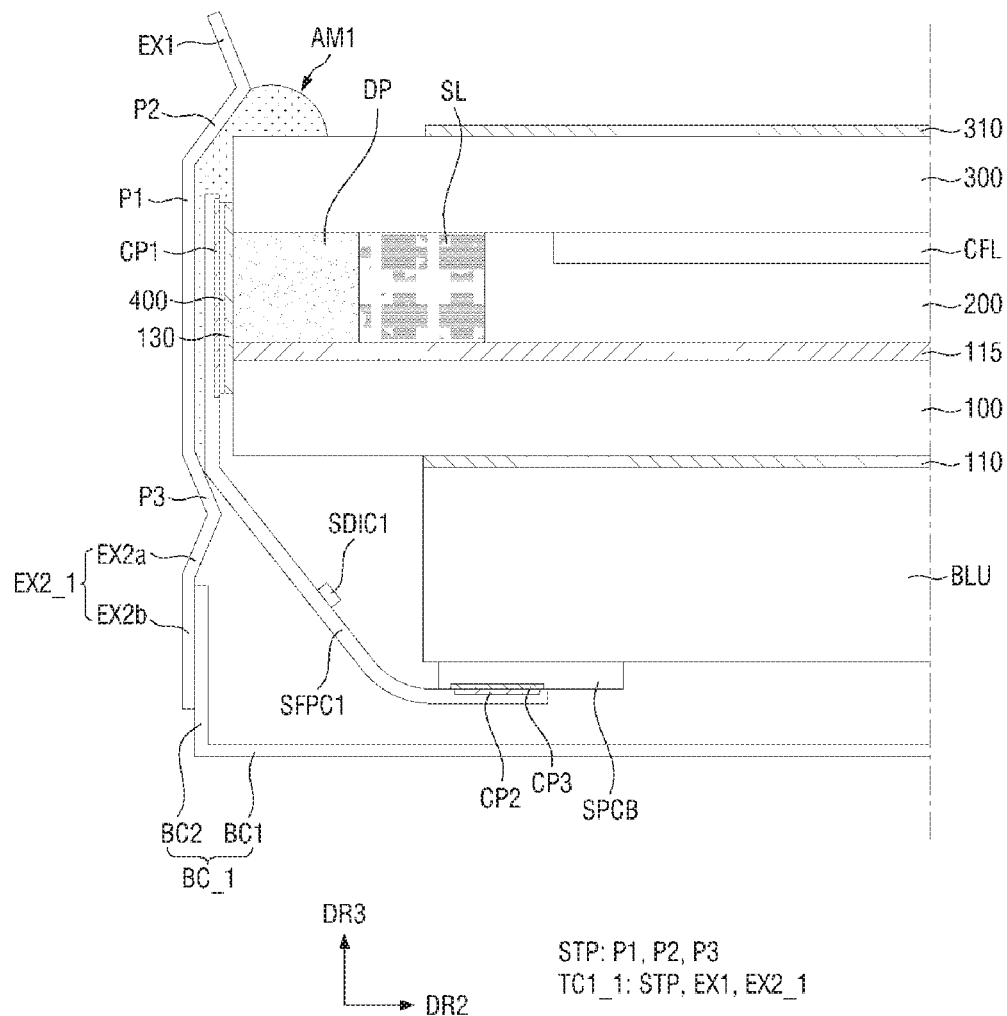
FIG. 14 is a cross-sectional view taken along the line I-I' of FIG. 2 according to another embodiment.
Figure 15:
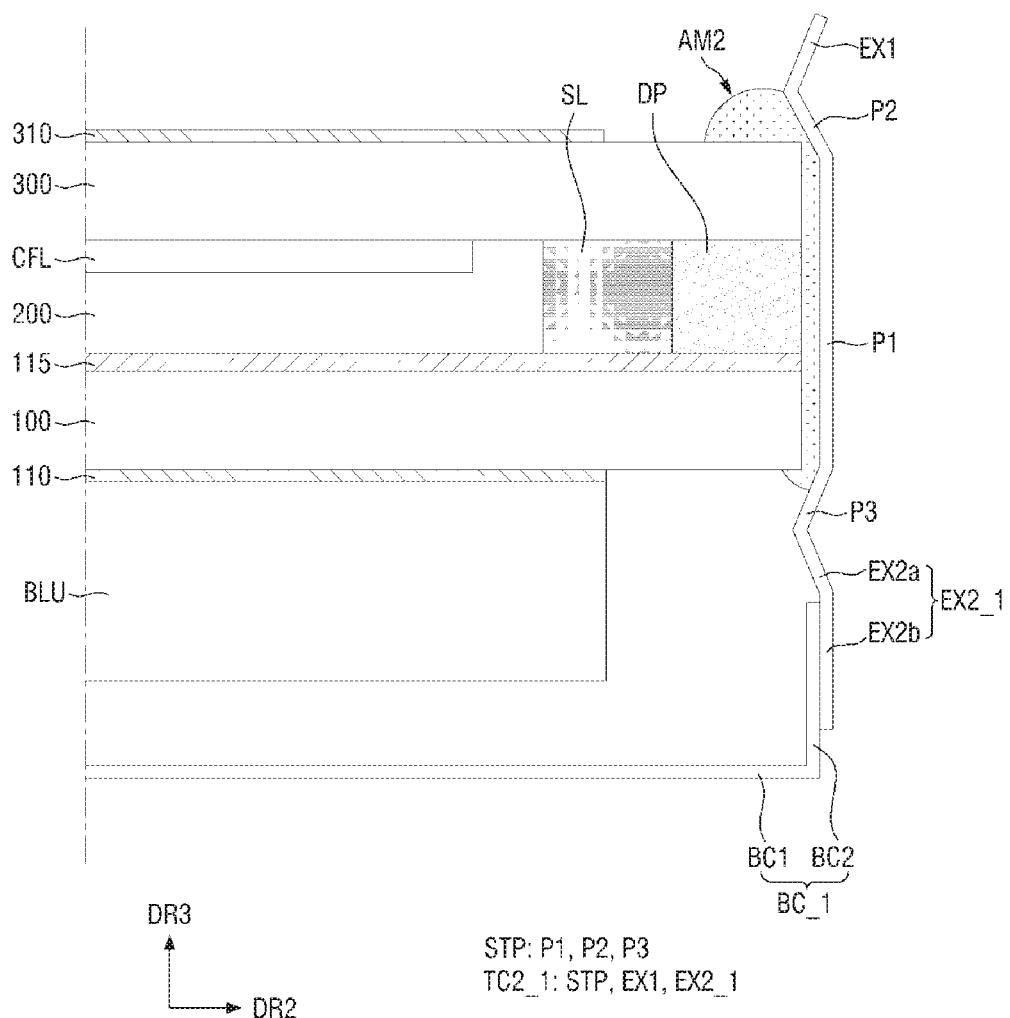
FIG. 15 is a cross-sectional view taken along the line II-II' of FIG. 2 according to another embodiment.
Figure 16:
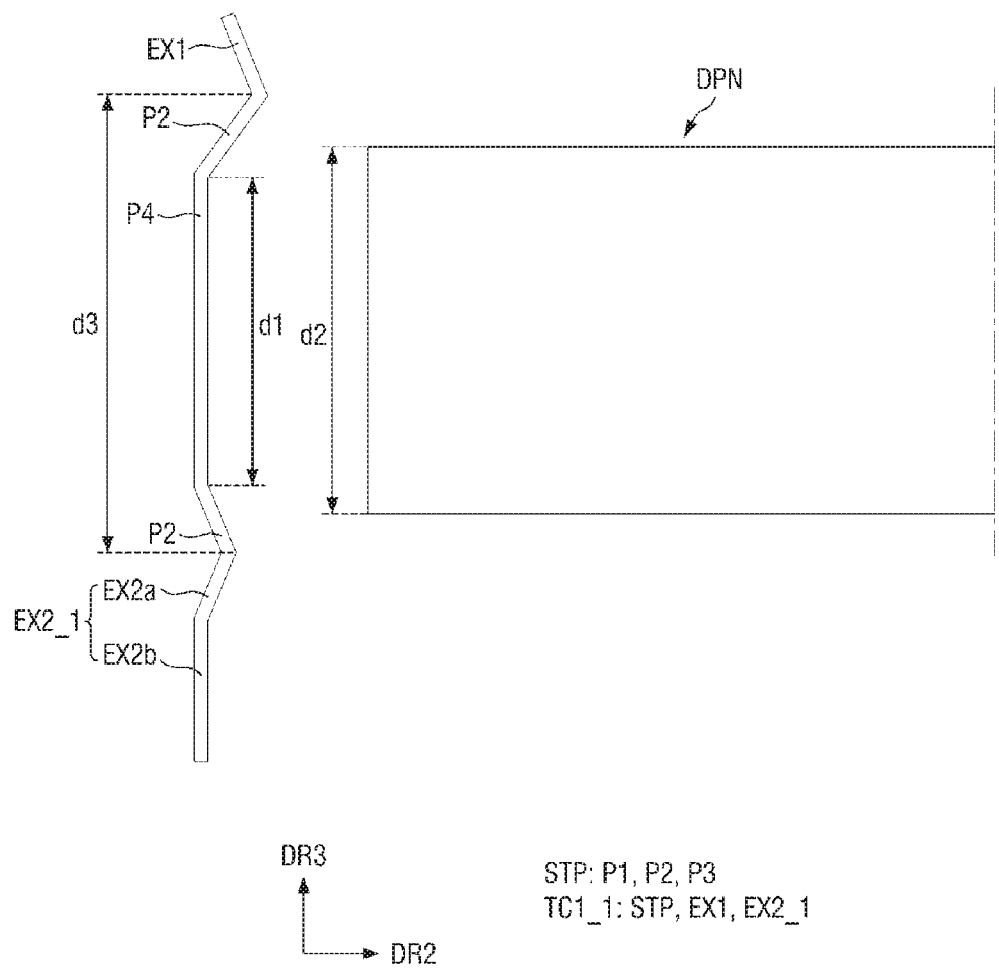
FIG. 16 shows a relationship of a display panel and an accommodation portion according to any of FIG. 14 and FIG. 15.

FIG. 14 is a cross-sectional view taken along the line I-I' of FIG. 2 according to another embodiment, FIG. 15 is a cross-sectional view taken along line II-II' of FIG. 2 according to another embodiment, and FIG. 16 is a view the relationship of a display panel and an accommodation portion according to any one of FIG. 14 and FIG. 15. The embodiment of FIGS. 14 to 16 is different from the aforementioned embodiment of FIGS. 7 to 9 in that a second extension portion EX2_1 of the top cover TC includes an inclined portion EX2a and a vertical portion EX2b.

Referring to FIGS. 14 to 16, each of the first top cover TC1_1 and the second top cover TC2_1 may include an accommodation portion STP, a first extension portion EX1 and a second extension portion EX2_1.

The accommodation portion STP of each of the first top cover TC1_1 and the second top cover TC2_1 may include a first portion P1 and a second portion P2 extending from one end of the first portion P1, and a third portion P3 extending from the other end of the first portion P1. The first extension portion EX1 may be an inclined surface extending from the second portion P2 in the third direction DR3 and inclined at a predetermined angle from the second portion P2.

The second extension portion EX2_1 of each of the first top cover TC1_1 and the second top cover TC2_1 may include an inclined portion EX2a and a vertical portion EX2b.

The inclined portion EX2a of the first top cover TC1_1 may be an inclined surface extending from the third portion P3 along the third direction DR3 and inclined at a predetermined angle from the third portion P3. The inclined portion EX2a may be an inclined surface extending from the third portion P3 and having an obtuse angle of inclination along the third direction DR3 with respect to the second direction DR2.

The inclined portion EX2a of the second top cover TC2_1 may be an inclined surface extending from the third portion P3 along the third direction DR3 and inclined at a predetermined angle from the third portion P3. The inclined portion EX2a may be an inclined surface extending from the third portion P3 and having an acute angle of inclination along the third direction DR3 with respect to the second direction DR2.

The vertical portion EX2b of each of the first top cover TC1_1 and the second top cover TC2_1 may be a vertical surface extending from the inclined portion EX2a along the third direction DR3, and may be fixed to the bottom cover BC_1. For example, the vertical portion EX2b may be fixed to the side wall portion BC2 through an adhesive material, or may be fixed to the side wall portion BC2 through an attachment member such as a screw.

One side surface of the display panel DPN may be disposed over the first portion P1, second portion P2 and third portion P3 of the accommodation portion STP. The first length d1 of the first portion P1 in the third direction DR3 may be shorter than the second length d2 of one side surface of the display panel DPN in the third direction DR3, and the third length d2 of the accommodation portion STP in the third direction DR3 may be longer than the second length d2 of one side surface of the display panel DPN in the third direction DR3.

Since the second extension portion EX2_1 of each of the first top cover TC1_1 and the second top cover TC2_1 includes the inclined portion EX2a and the vertical portion EX2b, the alignment of the display panel DPN with the first top cover TC1_1 and the second top cover TC2_1 may be further facilitated to obtain proper fit therebetween.

In each of the above descriptions, one or more of the extension portions EX1 and EX2_1 may extend in the third direction DR3 so as to be offset from each other and the accommodation portion STP in the second direction DR2 and/or the third direction D3. In this respect, one or more of the portions P1, P2, and P3 of the accommodation portion STP may also extend in the third direction DR3 so as to be offset from each other and one or more of the extension portions EX1 and EX2_1 in the second direction DR2 and/or the third direction D3. In these respects, the offset of one or more of the extension portions EX1 and EX2_1 and portions P1, P2, and P3 may be provided as one or more of the aforementioned may be slantingly disposed from an adjacent one of connected portions. In these ways, the accommodation portion STP may be disposed around operative connections for the pixels and the side surface of the display panel DP. As such, the operative connections for the pixels SPX and the side surface of the display panel DP may be properly aligned with the top covers TC1 and TC2 and the perception of the bezel may be reduced to enhance visualization of an image to be displayed by display devices 1 of a tiled display TD thereof.

Figure 17:
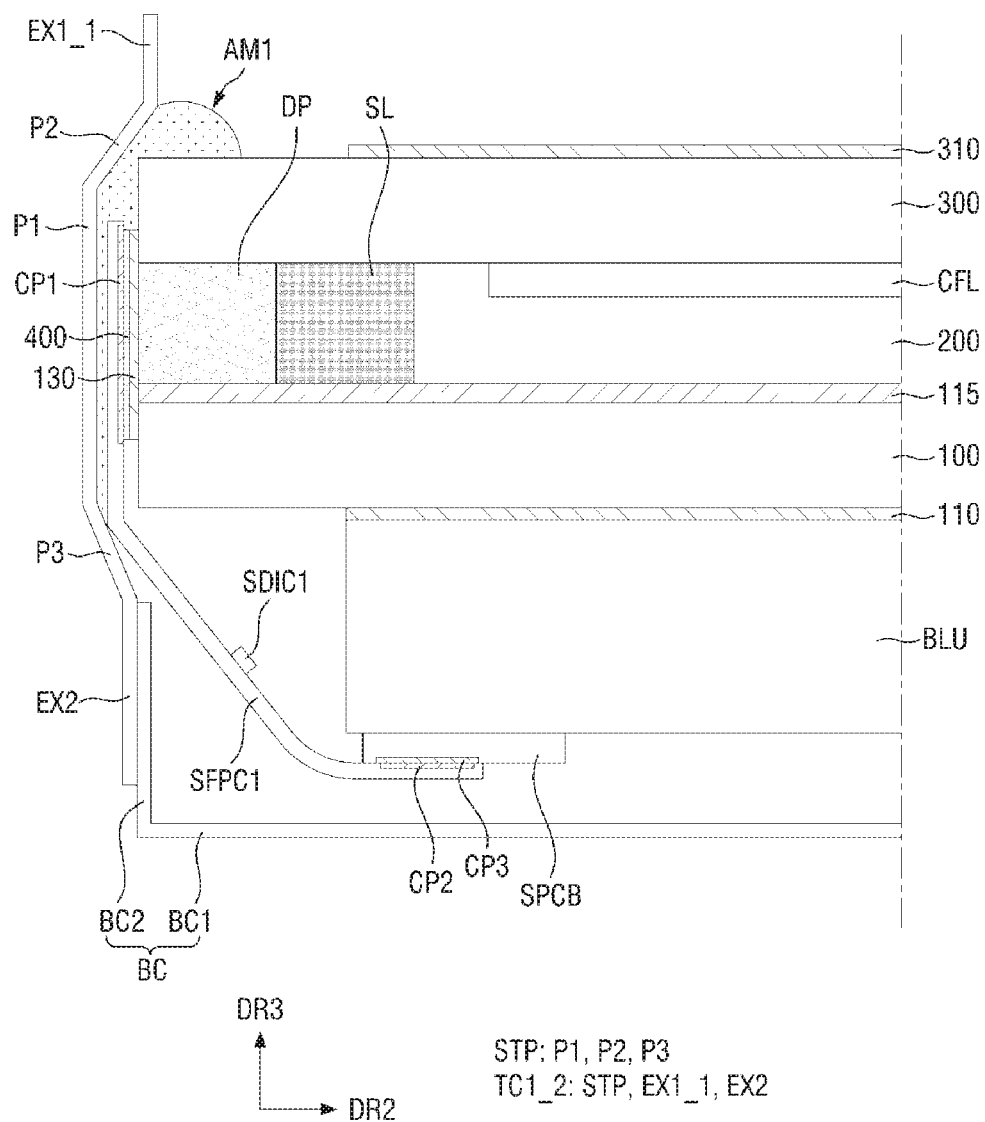
FIG. 17 is a cross-sectional view taken along the line I-I' of FIG. 2 according to another embodiment.
Figure 18:
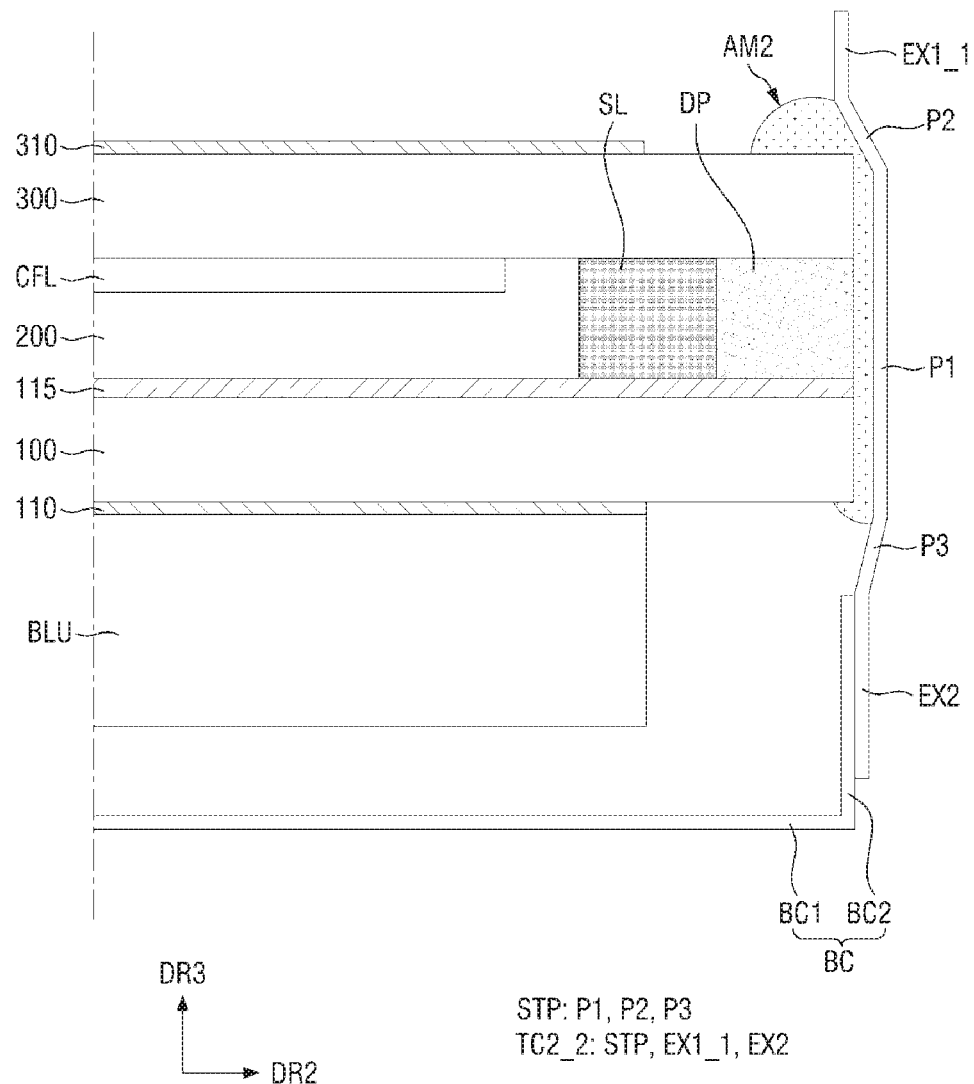
FIG. 18 is a cross-sectional view taken along the line II-II' of FIG. 2 according to another embodiment.
Figure 19:
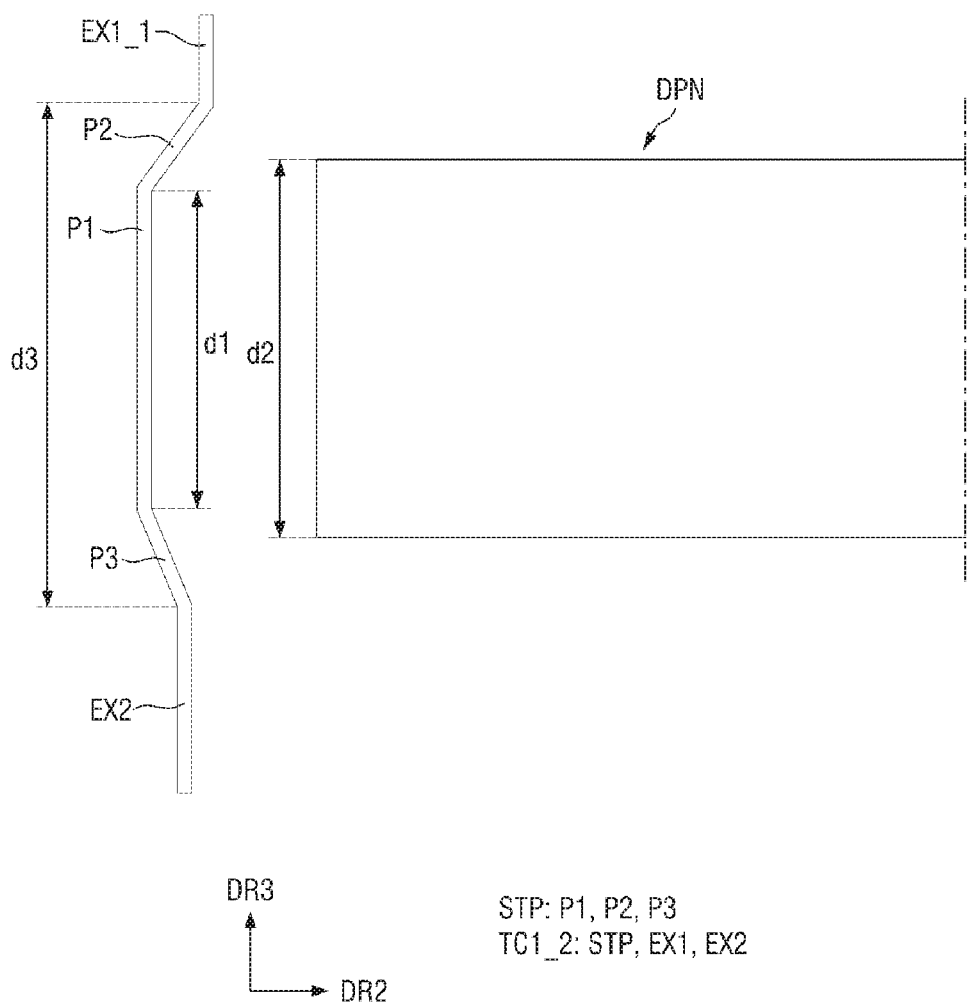
FIG. 19 shows a relationship of a display panel and an accommodation portion according to any of FIG. 17 and FIG. 18.

FIG. 17 is a cross-sectional view taken along line I-I' of FIG. 2 according to another embodiment, FIG. 18 is a cross-sectional view taken along line II-II' of FIG. 2 according to another embodiment, and FIG. 19 is a view the relationship of a display panel and an accommodation portion according to any one of FIG. 17 and FIG. 18. The embodiment of FIGS. 17 to 19 is different from the aforementioned embodiment of FIGS. 7 to 9 in that the first extension portion EX1_1 of the top cover TC is disposed as a vertical surface extending in the third direction DR3.

Referring to FIGS. 17 to 19, each of the first top cover TC1_2 and the second top cover TC2_2 may include an accommodation portion STP, a first extension portion EX1_1 and a second extension portion EX2.

The accommodation portion STP of each of the first top cover TC1_1 and the second top cover TC2_1 may include a first portion P1, a second portion P2 extending from one end of the first portion P1, and a third portion P3 extending from the other end of the portion P1. The first extension portion EX1 may be an inclined surface extending from the second portion P2 in the third direction DR3 and inclined at a predetermined angle from the second portion P2.

The first extension portion EX1_1 of each of the first top cover TC1_1 and the second top cover TC2_1 may be a vertical surface extending from the first portion P1 in the third direction DR3. As such, since the first extension portion EX1_1 of each of the first top cover TC1_1 and the second top cover TC2_1 is a vertical surface extending from the first portion P1 in the third direction DR3, the bezel of the display device 1 may be reduced, and thus the perception of an immersion of an image among several display devices 1 of the tiled display apparatus TD may be achieved.

Figure 20:
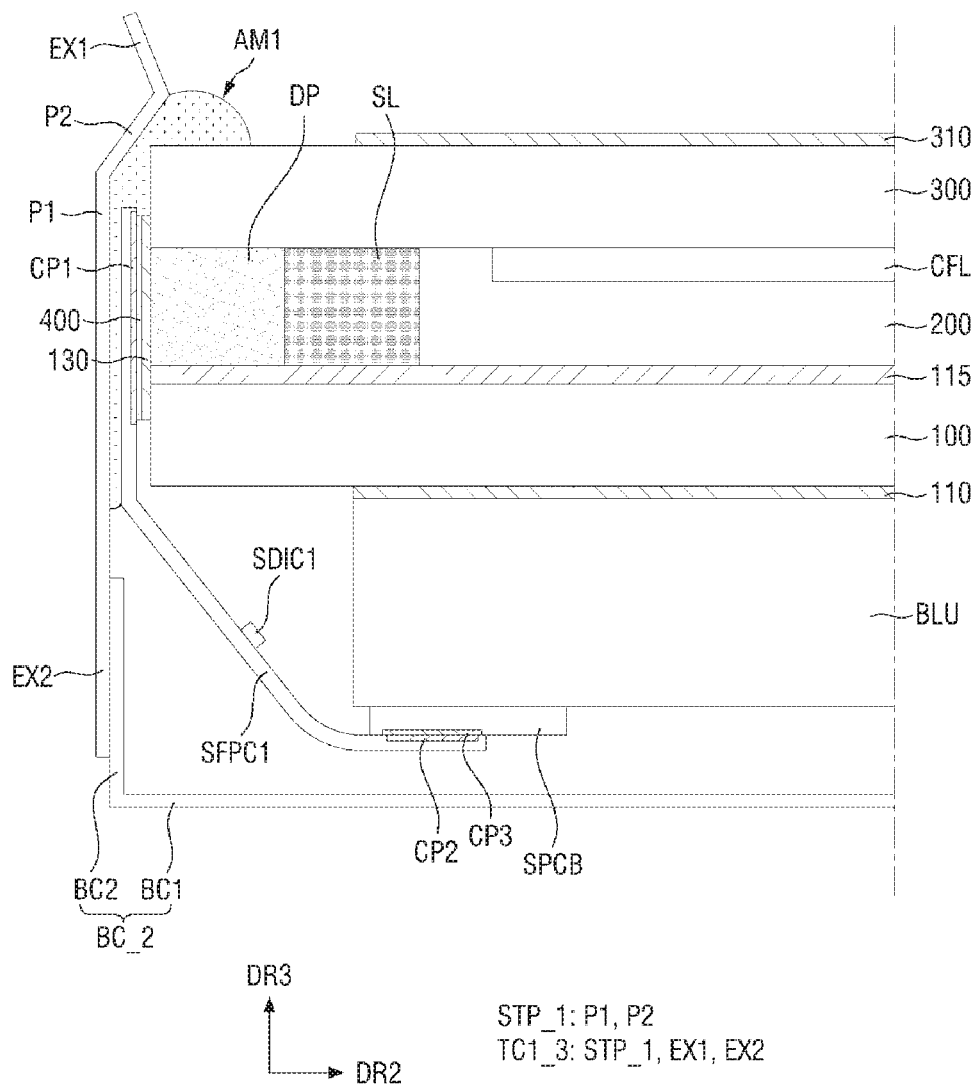
FIG. 20 is a cross-sectional view taken along the line I-I' of FIG. 2 according to another embodiment.
Figure 21:
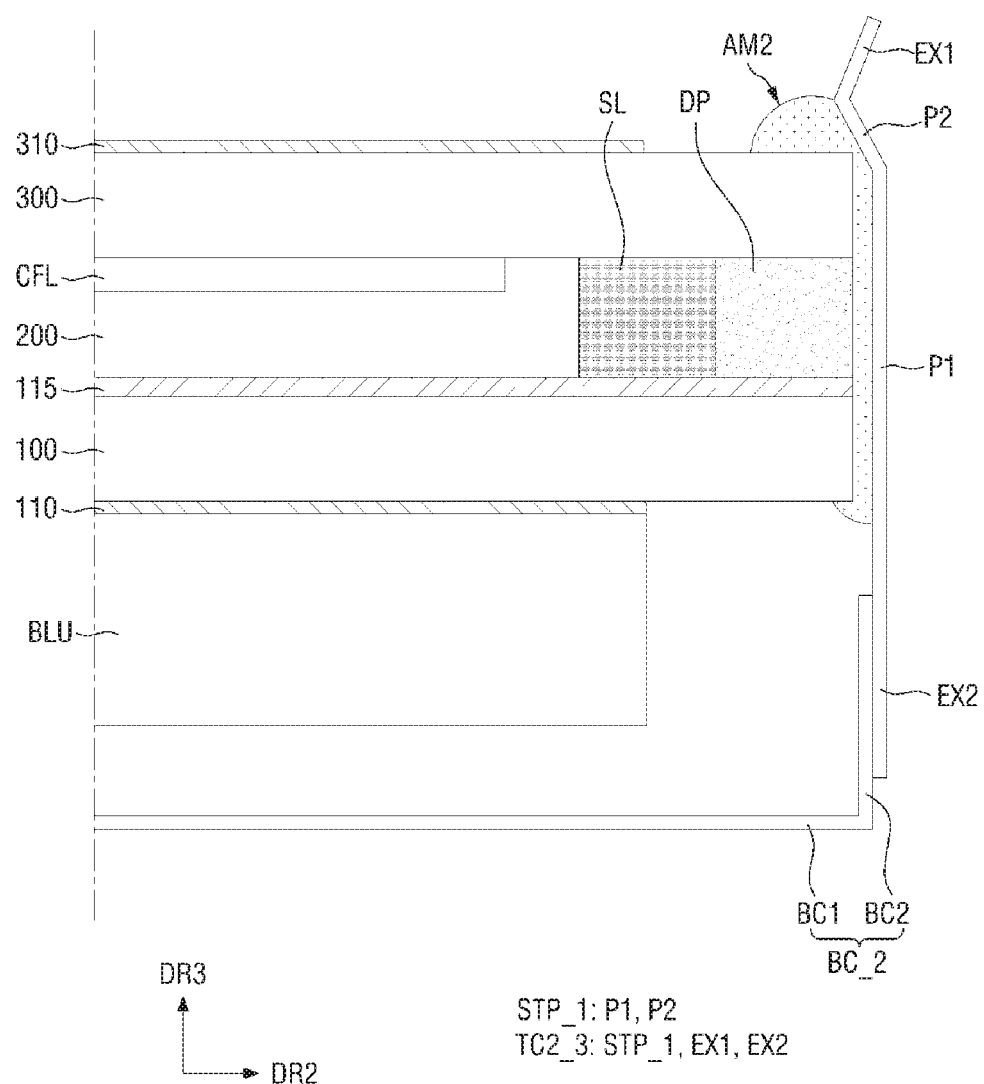
FIG. 21 is a cross-sectional view taken along the line II-II' of FIG. 2 according to another embodiment.
Figure 22:
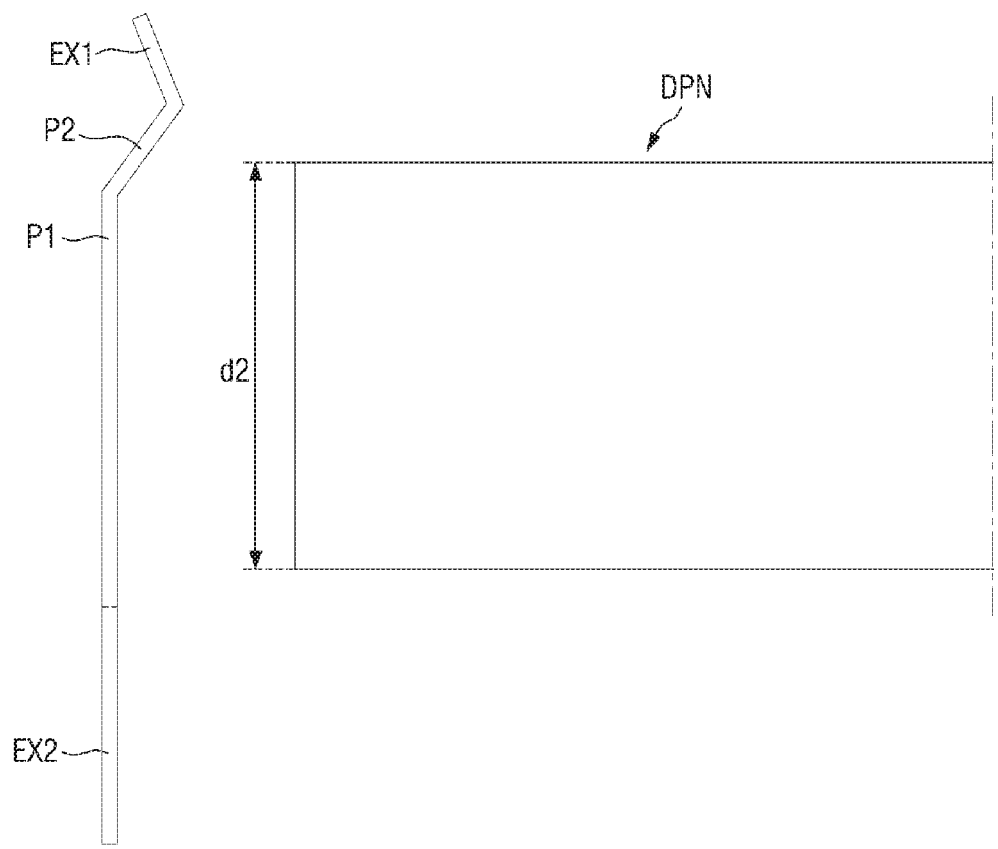
FIG. 22 shows a relationship of a display panel and an accommodation portion according to any of FIG. 20 and FIG. 21.

FIG. 20 is a cross-sectional view taken along the line I-I' of FIG. 2 according to another embodiment, FIG. 21 is a cross-sectional view taken along the line II-II' of FIG. 2 according to another embodiment, and FIG. 22 is a view the relationship of a display panel and an accommodation portion. The embodiment of FIGS. 20 to 22 is different from the aforementioned embodiment of FIGS. 7 to 9 in that an accommodation portion STP_1 of the top cover TC includes a first portion P1 and a second portion P2.

Referring to FIGS. 20 to 22, each of the first top cover TC1_3 and the second top cover TC2_3 may include an accommodation portion STP_1, a first extension portion EX1 and a second extension portion EX2.

The accommodation portion STP_1 of each of the first top cover TC1_3 and the second top cover TC2_3 may include a first portion P1 and a second portion P2 extending from one end of the first portion P1. The first portion P1 may be vertical surface extending in the third direction DR3, and the second portion P2 may be an inclined surface extending from the first portion P1 in the third direction DR3 and inclined at a predetermined angle from the first portion P1.

The second portion P2 of the first top cover TC1_3 may be an inclined surface extending from the first portion P1 and having an acute angle of inclination in the third direction DR3 with respect to the second direction DR2. The second portion P2 may face one side edge of the second substrate 300.

The second portion P2 of the second top cover TC2_3 may be an inclined surface extending from the first portion P1 and having an obtuse angle of inclination in the third direction DR3 with respect to the second direction DR2. The second portion P2 may face the other side edge of the second substrate 300.

The first extension portion EX1 may be an inclined surface extending from the second portion P2 in the third direction DR3 and may be inclined at a predetermined angle from the second portion P2. The second extension portion EX2 may be a vertical surface extending from the first portion P1 along the third direction DR3. Since the accommodation portion STP_1 of each of the first top cover TC1_3 and the second top cover TC2_3 includes only the first portion P1 and the second portion P2, fixation of the bottom cover BC to the first top cover TC1_3 and the second top cover TC2_3 may be facilitated.

Figure 23:
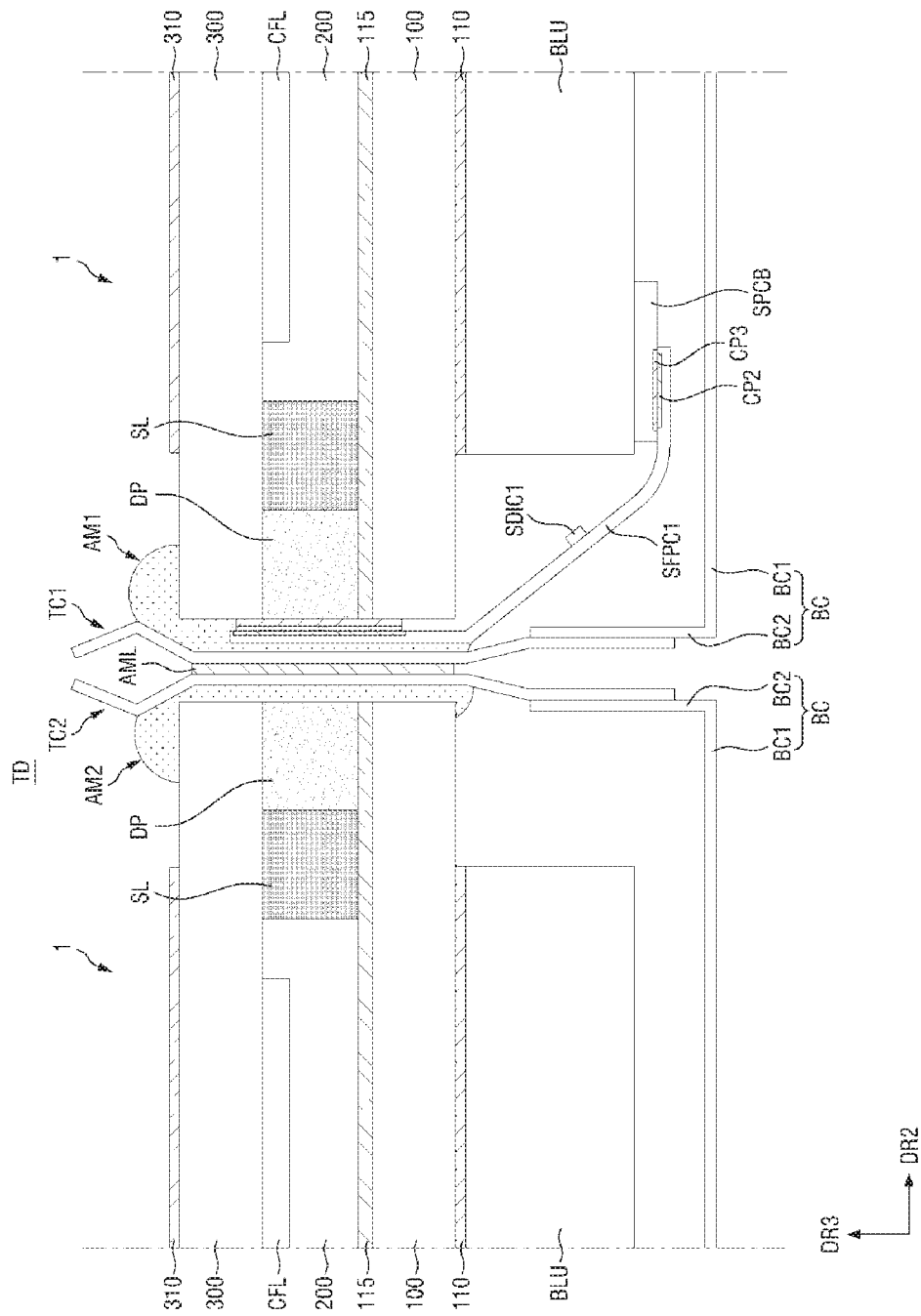
FIG. 23 is a cross-sectional view schematically showing the connection of a tiled display apparatus according to an embodiment.

FIG. 23 is a cross-sectional view schematically showing the connection portion of a tiled display apparatus according to an embodiment. Since the configuration of the individual display devices 1 constituting the tiled display apparatus has been described above, further description is omitted.

Referring to FIG. 23, as described above, the side surfaces of the display panels DPN included in the individual display devices 1 may be more firmly adhered and fixed with the accommodation portions STP, first extension portions EX1 and second extension portions EX2 of the first top cover TC1 and the second top cover TC2.

The individual display devices 1 may be connected to each other through the adhesive member AML disposed between the first top cover TC1 and second top cover TC2 of each of the individual display devices 1 in a state where the display panels DPN are stably fixed to the first top cover TC1 and the second top cover TC2. Further, since the first extension portions EX1 of the first top cover TC1 and the second top cover TC2 are surfaces that are inclined to face each other, perception of the bezel of each of the individual display devices 1 may be reduced, and thus it is possible to avoid the perception that the bezel interferes with or distorts perception of an image to be displayed by one or more individual display devices 1 of a tiled display apparatus TD.

Although embodiments of the invention have been disclosed as shown in the drawings and described hereinabove, those skilled in the art will appreciate that various modifications, additions and substitutions are possible, without departing from the scope and spirit of the invention as described in the accompanying claims.

What is claimed is:

1. A display device, comprising:
a display panel; and
a top cover disposed around a side surface of the display panel, wherein
the top cover includes:
an accommodation portion corresponding to the side surface of the display panel;
a first extension portion extending from an upper end of the accommodation portion; and
a second extension portion extending from a lower end of the accommodation portion, the first extension portion being offset from the second extension portion, and
at least one portion of the top cover extends at an incline angle relative to the side surface of the display panel.

2. The display device of claim 1, wherein the first extension portion is angled away from a display area of a top surface of the display panel.

3. A display device, comprising:
a display panel; and
a top cover dispose around a side surface of the display panel, wherein
the top cover includes:
an accommodation portion corresponding to the side surface of the display panel;
a first extension portion extending from an upper end of the accommodation portion; and
a second extension portion extending from a lower end of the accommodation portion, the first extension portion being offset from the second extension portion, and the accommodation portion includes:
a first portion as a vertical surface and having a length that is shorter than a length of the side surface of the display panel;

a second portion as an inclined surface extending from an upper end of the first portion toward the side surface of the display panel; and a third portion as an inclined surface extending from a lower end of the first portion toward the side surface of the display panel.

4. The display device of claim 3, wherein the first extension portion includes an inclined surface extending from the first portion away from the side surface of the display panel.

5. The display device of claim 4, wherein the second extension portion includes a vertical surface extending from the third portion.

6. The display device of claim 5, further comprising:

a bottom cover disposed under the display panel and including a bottom portion and a side wall portion, wherein the second extension portion is fixed to the side wall portion.

7. The display device of claim 6, wherein the side surface of the display panel is spaced from the first portion of the accommodation portion.

8. The display device of claim 7, further comprising:

an adhesive member disposed between the first portion of the accommodation portion and the side surface of the display panel.

9. The display device of claim 8, wherein the second portion of the accommodation portion faces an upper edge of the display panel, and the third portion of the accommodation portion faces a lower edge of the display panel.

10. The display device of claim 9, wherein the adhesive member is disposed between the second portion of the accommodation portion and the display panel.

11. A display device, comprising:

a display panel including a first substrate, a second substrate facing the first substrate, a connection wiring disposed on the first substrate, and a connection pad disposed on the first substrate and the second substrate, and electrically connected to the connection wiring; and a top cover attached to the display panel, wherein the top cover includes an accommodation portion corresponding to a side surface of the first substrate, a side surface of the second substrate, and the connection pad, a first extension portion extending from an upper end of the accommodation portion, and a second extension portion extending from a lower end of the accommodation portion, the first extension portion being offset from the second extension portion.

12. The display device of claim 11, wherein the accommodation portion includes a first portion as a vertical surface, a second portion as an inclined surface extending from an upper end of the first portion toward a side surface of the second substrate, and a third portion as an inclined surface extending from a lower end of the first portion toward a side surface of the first substrate, and a length of the first portion in the first direction is shorter than a length of a side surface of the display panel.

13. The display device of claim 12, wherein the first extension portion is an inclined surface extending from the first portion away from the side surface of the display panel, and the second extension portion is a vertical surface extending from the third portion.

14. The display device of claim 13, wherein the first portion of the accommodation portion is spaced from the connection pad.

15. The display device of claim 14, further comprising:

an adhesive member disposed between the first portion of the accommodation portion and the connection pad.

16. The display device of claim 15, wherein the second portion of the accommodation portion faces an upper edge of the second substrate, and the third portion of the accommodation portion faces a lower edge of the first substrate.

17. The display device of claim 16, wherein the adhesive member is disposed between the second portion of the accommodation portion and the second substrate, and the adhesive member is disposed on the side surface of the second substrate and a part of an upper surface of the second substrate.

18. The display device of claim 17, further comprising:

a flexible circuit board electrically connected to the connection pad, wherein the flexible circuit board is disposed between the adhesive member and the connection pad.

19. The display device of claim 18, further comprising:

a contact pad disposed on a surface of the flexible circuit board, wherein the contact pad is in contact with the connection pad through an adhesive film.

20. The display device of claim 19, wherein the adhesive member includes a resin, and the adhesive film includes an anisotropic conductive film.

21. The display device of claim 20, wherein a surface of the flexible circuit board is attached to the first portion of the accommodation portion through the adhesive member.

* * * * *